(12) United States Patent
Takahashi et al.

(10) Patent No.: US 9,035,301 B2
(45) Date of Patent: May 19, 2015

(54) IMAGING DEVICE

(71) Applicant: SEMICONDUCTOR ENERGY LABORATORY CO., LTD., Atsugi-shi, Kanagawa-ken (JP)

(72) Inventors: Hironobu Takahashi, Tochigi (JP);
Yukinori Shima, Gunma (JP);
Yasuharu Hosaka, Tochigi (JP);
Toshimitsu Obonai, Tochigi (JP);
Masashi Tsubuku, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/303,629

(22) Filed: Jun. 13, 2014

(65) Prior Publication Data
US 2014/0374745 A1 Dec. 25, 2014

(30) Foreign Application Priority Data

Jun. 19, 2013 (JP) ................................. 2013-128794

(51) Int. Cl.
*H01L 29/22* (2006.01)
*H01L 27/146* (2006.01)
*H01L 29/786* (2006.01)

(52) U.S. Cl.
CPC .... *H01L 27/14663* (2013.01); *H01L 27/14659* (2013.01); *H01L 27/14616* (2013.01); *H01L 27/14625* (2013.01); *H01L 29/7869* (2013.01)

(58) Field of Classification Search
USPC ......................................................... 257/43
See application file for complete search history.

(56) References Cited

U.S. PATENT DOCUMENTS

| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Thao P Le
(74) *Attorney, Agent, or Firm* — Nixon Peabody LLP; Jeffrey L. Costellia

(57) ABSTRACT

An imaging device that is highly stable to irradiation with radial rays such as X-rays and can inhibit a decrease in electrical characteristics is provided. The imaging device takes an image with radial rays such as X-rays and includes pixel circuits arranged in a matrix and a scintillator overlapping the pixel circuits. The pixel circuits each includes a switching transistor with an extremely small off-state current and a light-receiving element which is configured to convert the radial rays to electrical charges. A gate insulating film of the switching transistor has a stacked structure including a silicon nitride film with a thickness of 100 nm to 400 nm and a silicon oxide film or a silicon oxynitride film with a thickness of 5 nm to 20 nm.

17 Claims, 16 Drawing Sheets

(56) References Cited

U.S. PATENT DOCUMENTS

| | | | |
|---|---|---|---|
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,193,031 B2 | 6/2012 | Hosoba et al. |
| 8,207,014 B2 | 6/2012 | Sasaki et al. |
| 8,470,650 B2 | 6/2013 | Akimoto et al. |
| 8,546,180 B2 | 10/2013 | Yamazaki et al. |
| 8,624,237 B2 | 1/2014 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0047785 A1 | 3/2003 | Kawasaki et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0285516 A1* | 12/2005 | Godo et al. ................. 313/506 |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0283049 A1 | 11/2010 | Sato et al. |
| 2010/0304529 A1 | 12/2010 | Sasaki et al. |
| 2012/0235113 A1* | 9/2012 | Yoshinari ........................ 257/10 |
| 2012/0273780 A1 | 11/2012 | Yamazaki et al. |
| 2012/0280230 A1 | 11/2012 | Akimoto et al. |
| 2014/0054466 A1 | 2/2014 | Kurokawa et al. |
| 2014/0077204 A1* | 3/2014 | Saito et al. ..................... 257/43 |
| 2014/0284594 A1* | 9/2014 | Nakano et al. .................. 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 11-311673 A | 11/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2009-141002 A | 6/2009 |
| WO | WO-2004/114391 | 12/2004 |

OTHER PUBLICATIONS

Asaoka.Y et al., "29:1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(56) References Cited

OTHER PUBLICATIONS

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh,H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, andYb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semicondutor", Science, May 23, 2003, vol. 300, No. 5623, pp. 1269-1272.

(56) References Cited

OTHER PUBLICATIONS

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

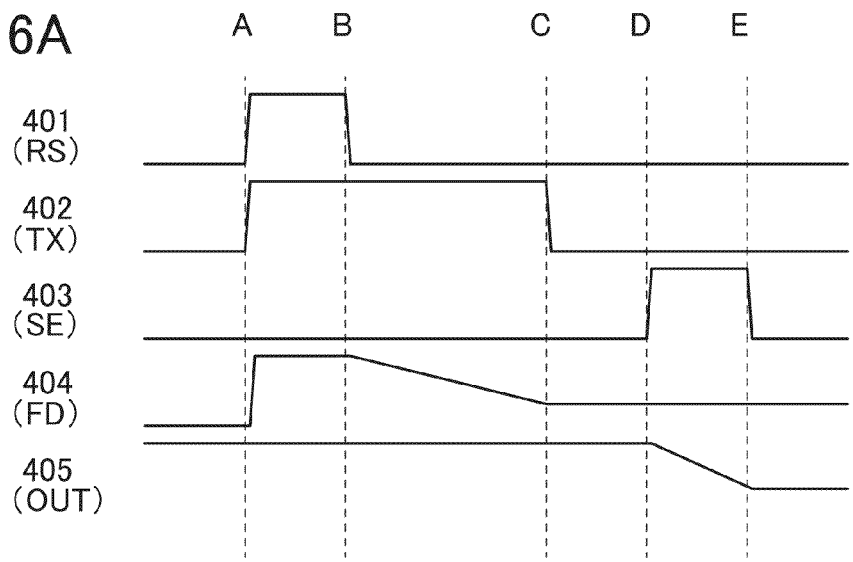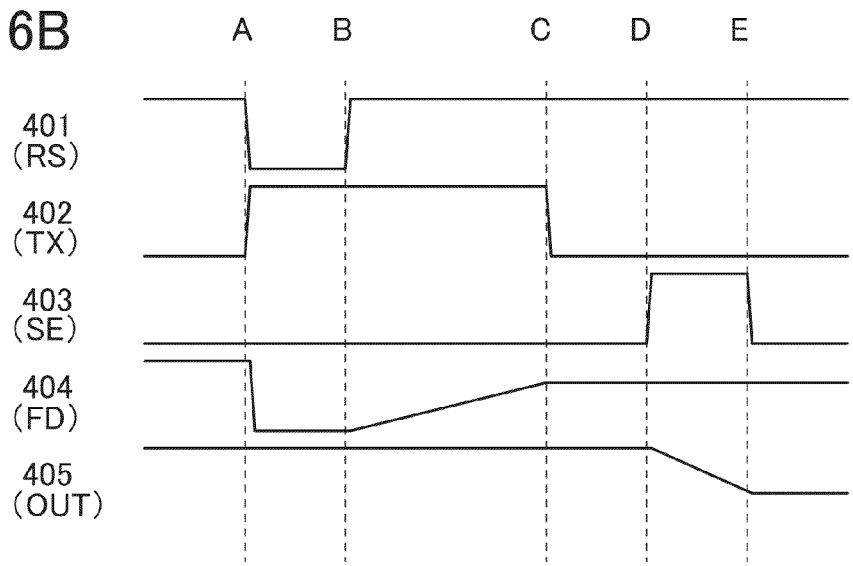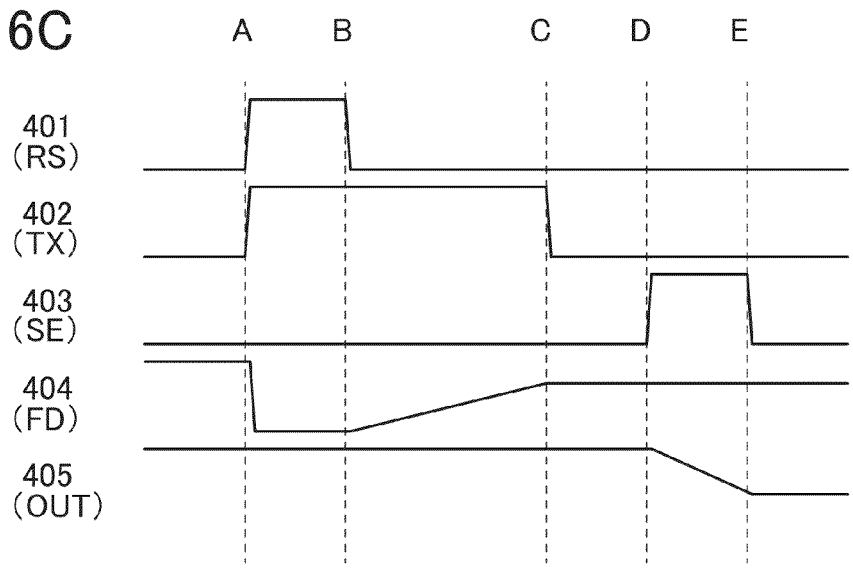

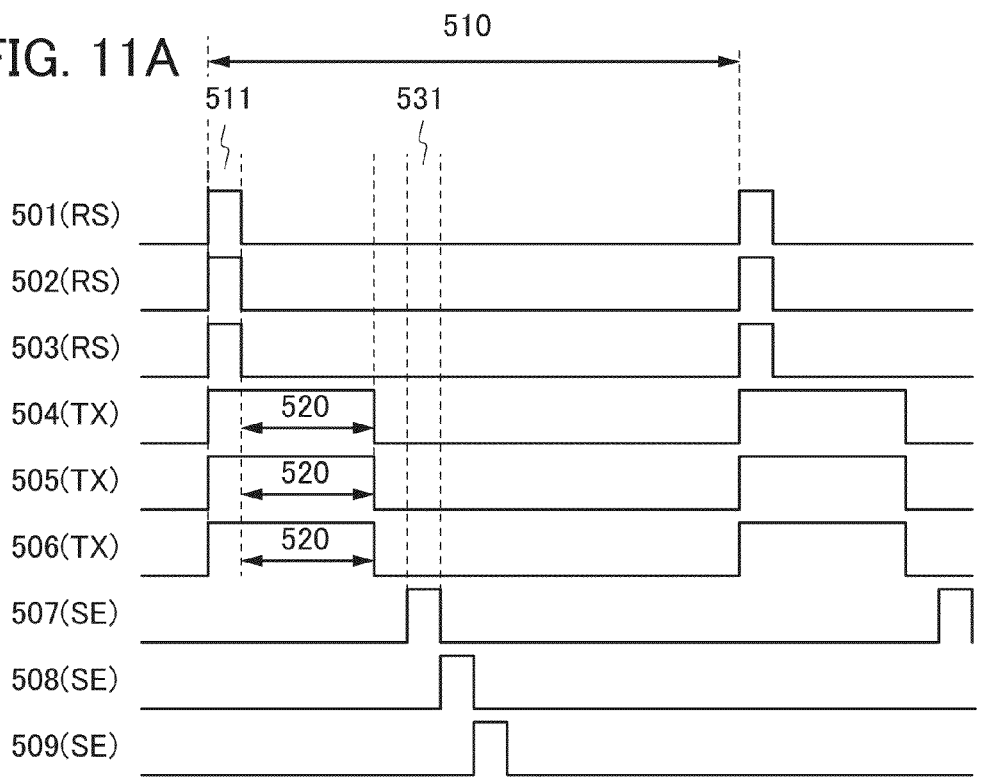
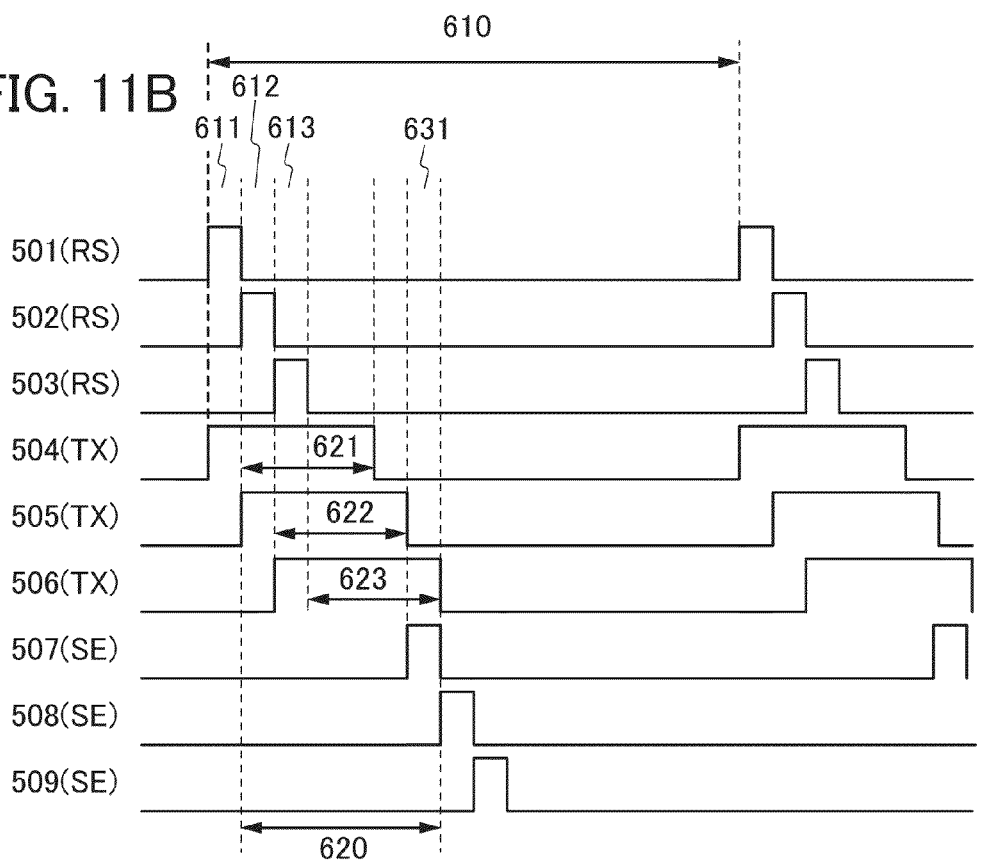

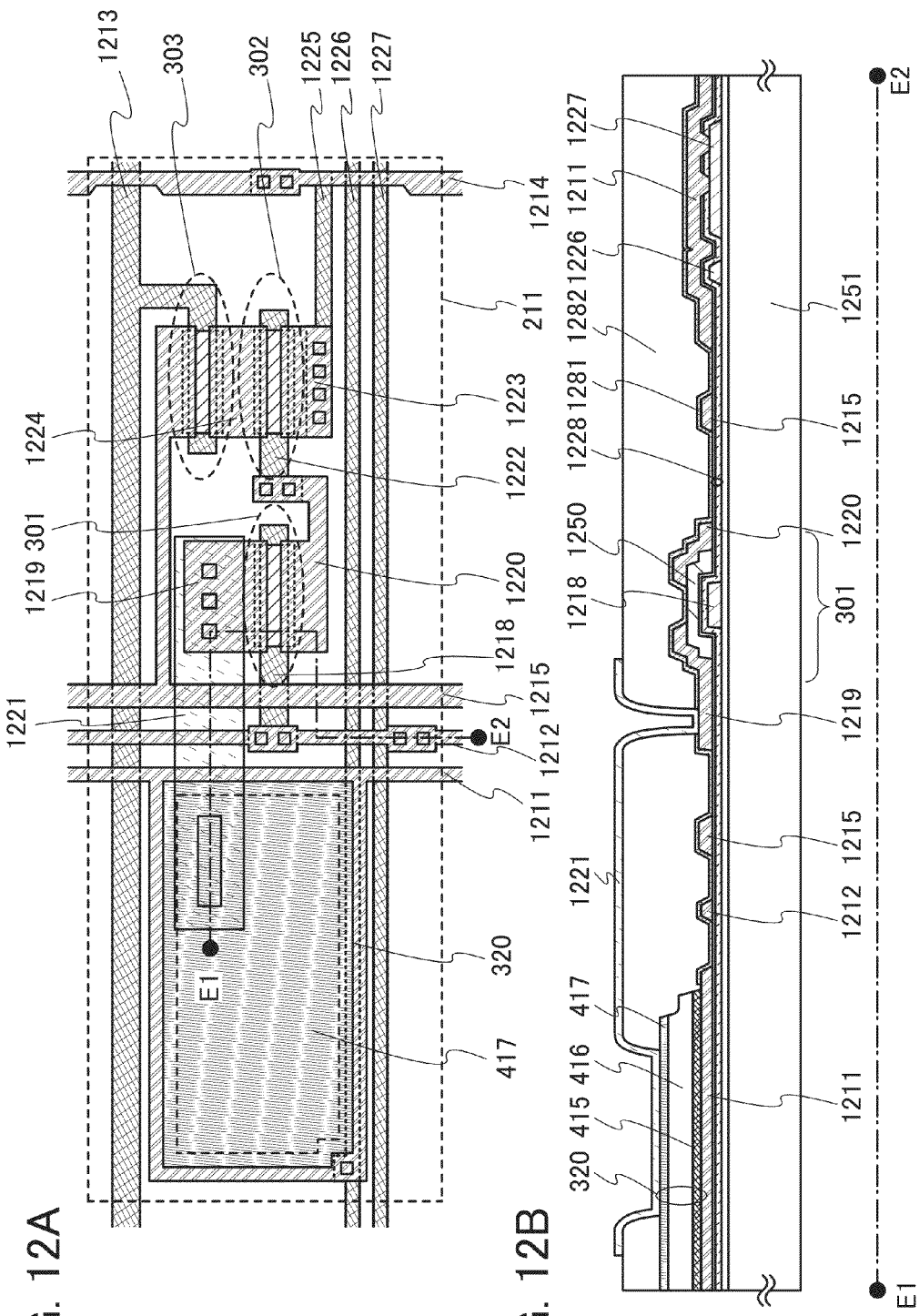

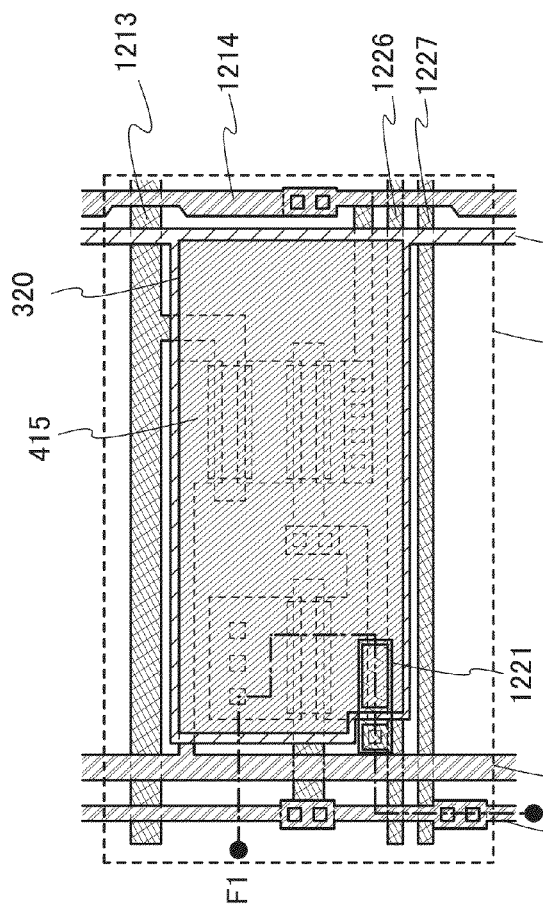
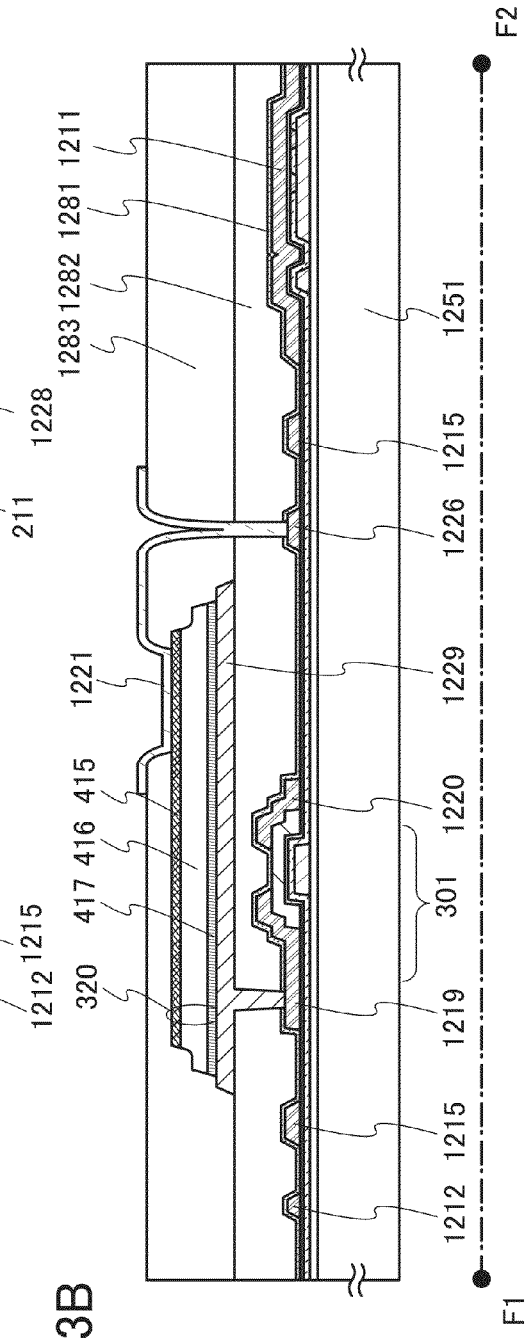
FIG. 13A
FIG. 13B

IMAGING DEVICE

BACKGROUND OF THE INVENTION

1. Field of the Invention

One embodiment of the present invention relates to an imaging device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, an imaging device, a method for driving any of them, and a method for manufacturing any of them.

In this specification and the like, a semiconductor device means a general device that can function by utilizing semiconductor characteristics. A transistor and a semiconductor circuit are embodiments of semiconductor devices. In some cases, a storage device, a display device, an imaging device, or an electronic device includes a semiconductor device.

2. Description of the Related Art

In medical practice, a medical diagnostic imaging device using a photographic technique has been in wide use. With the medical diagnostic imaging device, a specific portion of a patient is irradiated with X-rays, an X-ray film is exposed to X-rays that have passed through the specific portion, and the X-ray film is developed to visualize a state inside the specific portion.

Since the method using X-ray films needs a storage space for the X-ray films and maintenance thereof is troublesome, digitization of images is in progress. As a method for digitizing images, a method using an imaging plate is known. An imaging plate is irradiated with X-rays in a manner similar to that of the X-ray films and light emitted from the imaging plate is sensed with a scanner; thus, digitized images can be obtained.

The imaging plate is a plate to which a material having a property of emitting light by X-ray irradiation (this property is referred to as photostimulability, and the material having this property is referred to as a photostimulable phosphor) is applied and has higher detection sensitivity to X-ray absorption difference than an X-ray film does. In addition, data of X-ray irradiation can be erased, so that the imaging plate can be re-used. However, the data obtained by the imaging plate is analog, so that digitization treatment to digitize the data is necessary.

For this reason, attention has been recently focused on flat panel detectors capable of obtaining digital data directly (e.g., Patent Document 1). Flat panel detectors have two types of systems, direct and indirect conversion systems. In the direct conversion system, X-rays are directly converted to electrical charges with the use of an X-ray detecting element. In the indirect conversion system, X-rays are converted to visible light with a scintillator and the light is converted to electrical charges by a photodiode. In either of the systems, a flat panel detector includes a plurality of pixel circuits arranged in a matrix.

REFERENCE

Patent Document

[Patent Document 1] Japanese Published Patent Application No. H11-311673

SUMMARY OF THE INVENTION

A semiconductor material or an insulating material is included in transistors of the pixel circuits in the flat panel detector. When the semiconductor material or the insulating material is irradiated with radial rays having strong energy such as X-rays, defect states and the like are generated, so that electrical characteristics of the transistors are changed.

This phenomenon can occur by a slight amount of radial rays that have penetrated a scintillator, which is one cause for increasing power consumption or degrading reliability of the flat panel detector.

Thus, an object of one embodiment of the present invention is to provide an imaging device that is highly stable to irradiation with radial rays such as X-rays. Another object of one embodiment of the present invention is to provide an imaging device having a structure that can inhibit a decrease in electrical characteristics. Another object of one embodiment of the present invention is to provide an imaging device with high resolution. Another object of one embodiment of the present invention is to provide an imaging device capable of taking an image with low dose of radiation. Another object of one embodiment of the present invention is to provide an imaging device with low power consumption. Another object of one embodiment of the present invention is to provide an imaging device with high reliability. Another object of one embodiment of the present invention is to provide a novel imaging device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention relates to an imaging device that includes a transistor using an oxide semiconductor in a pixel circuit and takes an image with radial rays such as X-rays.

One embodiment of the present invention is an imaging device that includes a light-receiving element and a circuit portion electrically connected to the light-receiving element. The circuit portion includes a transistor that includes: a gate electrode over an insulating surface; a gate insulating film including a first insulating film and a second insulating film in this order over the gate electrode; an oxide semiconductor layer overlapping with the gate electrode, over the gate insulating film; a source electrode layer and a drain electrode layer being in contact with part of the oxide semiconductor layer; and an insulating layer over the gate insulating film, the oxide semiconductor layer, the source electrode layer, and the drain electrode layer. In this imaging device, the first insulating film is a silicon nitride film, and the second insulating film is a silicon oxide film or a silicon oxynitride film. The first insulating film has a thickness of 100 nm to 400 nm, and the second insulating film has a thickness of 5 nm to 20 nm.

In the imaging device, a scintillator can be formed over the light-receiving element and the circuit portion.

As the light-receiving element, a photodiode or a variable resistive element including a semiconductor layer between a pair of electrodes can be used.

The above-described circuit portion can include a charge storage portion; a first transistor; a second transistor; and a third transistor. One of a source and a drain of the first transistor is electrically connected to the light-receiving element, and the other of the source and the drain of the first transistor is electrically connected to the charge storage portion. A gate of the second transistor is electrically connected to the charge storage portion, and one of a source and a drain of the second transistor is electrically connected to one of a source and a drain of the third transistor.

The above-described circuit portion can include a charge storage portion; a first transistor; a second transistor; a third transistor; and a fourth transistor. One of a source and a drain of the first transistor is electrically connected to the light-receiving element, and the other of the source and the drain of the first transistor is electrically connected to the charge storage portion. A gate of the second transistor is electrically connected to the charge storage portion, and one of a source and a drain of the second transistor is electrically connected to one of a source and a drain of the third transistor. One of a source and a drain of the fourth transistor is electrically connected to the charge storage portion.

With one embodiment of the present invention, an imaging device that is highly stable to irradiation with radial rays such as X-rays can be provided. An imaging device having a structure that can inhibit a decrease in electrical characteristics can be provided. An imaging device with high resolution can be provided. An imaging device capable of taking an image with low dose of radiation can be provided. An imaging device with low power consumption can be provided. An imaging device with high reliability can be provided. A novel imaging device or the like can be provided.

Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

In the accompanying drawings:
FIGS. 6A to 6C are timing charts showing the operation of a pixel circuit;
FIGS. 11A and 11B are timing charts illustrating the operations in a global shutter system and a rolling shutter system, respectively;
FIGS. 12A and 12B are a top view and a cross-sectional view illustrating a layout of a pixel circuit;
FIGS. 13A and 13B are a top view and a cross-sectional view illustrating a layout of a pixel circuit.

DETAILED DESCRIPTION OF THE INVENTION

Figure 1:
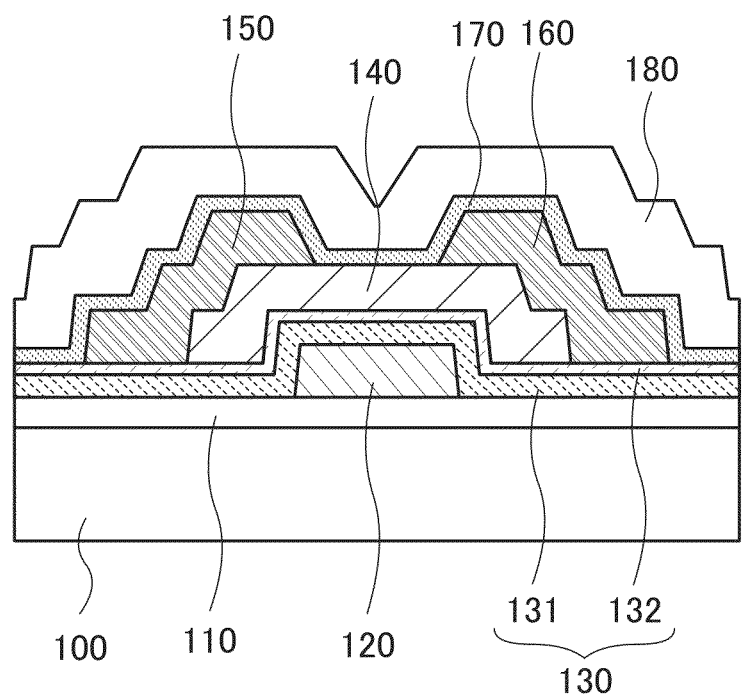
FIG. 1 is a cross-sectional view of a transistor.

Embodiments of the present invention will be described below in detail with reference to the drawings. However, the present invention is not limited to the description below, and it is easily understood by those skilled in the art that modes and details disclosed herein can be modified in various ways. Further, the present invention is not construed as being limited to description of the embodiments. Note that in all drawings used to illustrate the embodiments, portions that are identical or portion having similar functions are denoted by the same reference numerals, and their repetitive description may be omitted.

Note that in this specification and the like, an explicit description "X and Y are connected" means that X and Y are electrically connected, X and Y are functionally connected, and X and Y are directly connected. Here, X and Y each denote an object (e.g., a device, an element, a circuit, a wiring, an electrode, a terminal, a conductive film, a layer, or the like). Accordingly, without limiting to a predetermined connection relation, for example, a connection relation shown in drawings and texts, another element may be interposed between elements having the connection relation shown in the drawings and the texts.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be turned on or off. That is, a switch is conducting or not conducting (is turned on or off) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit, and a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. When a signal output from X is transmitted to Y, it can be said that X and Y are functionally connected even if another circuit is provided between X and Y.

Note that an explicit description "X and Y are connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, the explicit description "A and B are electrically connected" is the same as the description "A and B are connected".

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, each of X, Y, Z1, and Z2 denotes an object (e.g., a device, an element, a circuit, a wiring, an electrode, a terminal, a conductive film, a layer, or the like).

Note that in this specification and the like, a transistor can be formed using a variety of substrates. The type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used. As examples of the glass substrate, a barium borosilicate glass substrate, an aluminoborosilicate glass substrate, a soda lime glass substrate, and the like can be given. For the flexible substrate, a flexible synthetic resin such as plastic typified by polyethylene terephthalate (PET), polyethylene naphthalate (PEN), and polyether sulfone (PES), or acrylic can be used, for example. For the attachment film, polypropylene, polyester, polyvinyl fluoride, polyvinyl chloride, or the like can be used, for example. For the base material film, polyester, polyamide, polyimide, an inorganic vapor deposition film, paper, or the like can be used, for example. Specifically, when a transistor is formed using a semiconductor substrate, a single crystal substrate, an SOI substrate, or the like, it is possible to form a transistor with few variations in characteristics, size, shape, or the like, with high current supply capability, and with a small size. By forming a circuit with the use of such a transistor, power consumption of the circuit can be reduced or the circuit can be highly integrated.

Alternatively, a flexible substrate may be used as the substrate, and the transistor may be provided directly on the flexible substrate. Further alternatively, a separation layer may be provided between the substrate and the transistor. The separation layer can be used when part or the whole of a semiconductor device formed over the separation layer is separated from the substrate and transferred onto another substrate. In such a case, the transistor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

In other words, a transistor may be formed using one substrate, and then transferred to another substrate. Examples of a substrate to which a transistor is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. With the use of such a substrate, a transistor with excellent properties, a transistor with low power consumption, or a device with high durability can be formed, high heat resistance can be provided, or a reduction in weight or thickness can be achieved.

Embodiment 1

In this embodiment, an imaging device using radial rays such as X-rays, which is one embodiment of the present invention, is described with reference to the drawings.

FIG. 1 is a cross-sectional view of a transistor that can be used in an imaging device using radial rays such as X-rays, which is one embodiment of the present invention. The transistor includes a base insulating film 110 over a substrate 100, a gate electrode layer 120 over the base insulating film 110, a gate insulating film 130 including a first insulating film 131 and a second insulating film 132 in this order over the gate electrode layer, an oxide semiconductor layer 140 over the gate insulating film, and a source electrode layer 150 and a drain electrode layer 160 which are each in contact with part of the oxide semiconductor layer. An insulating layer 170 may be formed over the gate insulating film 130, the oxide semiconductor layer 140, the source electrode layer 150, and the drain electrode layer 160. In addition, an insulating layer 180 may be formed over the insulating layer.

In an imaging device of one embodiment of the present invention, an oxide semiconductor is used in an active layer as described above. Because a transistor using an oxide semiconductor layer has higher mobility than a transistor using amorphous silicon, in the case of using an oxide semiconductor layer, miniaturization of the transistor can be easily achieved and thus the pixel size can be made smaller; in other words, the resolution of the imaging device can be increased.

A silicon nitride film can be used as the first insulating film 131 included in the gate insulating film 130. The thickness of the silicon nitride film is preferably 100 nm to 400 nm. A silicon oxide film can be used as the second insulating film 132 included in the gate insulating film 130. The thickness of the silicon oxide film is preferably 5 nm to 20 nm.

Figure 2:
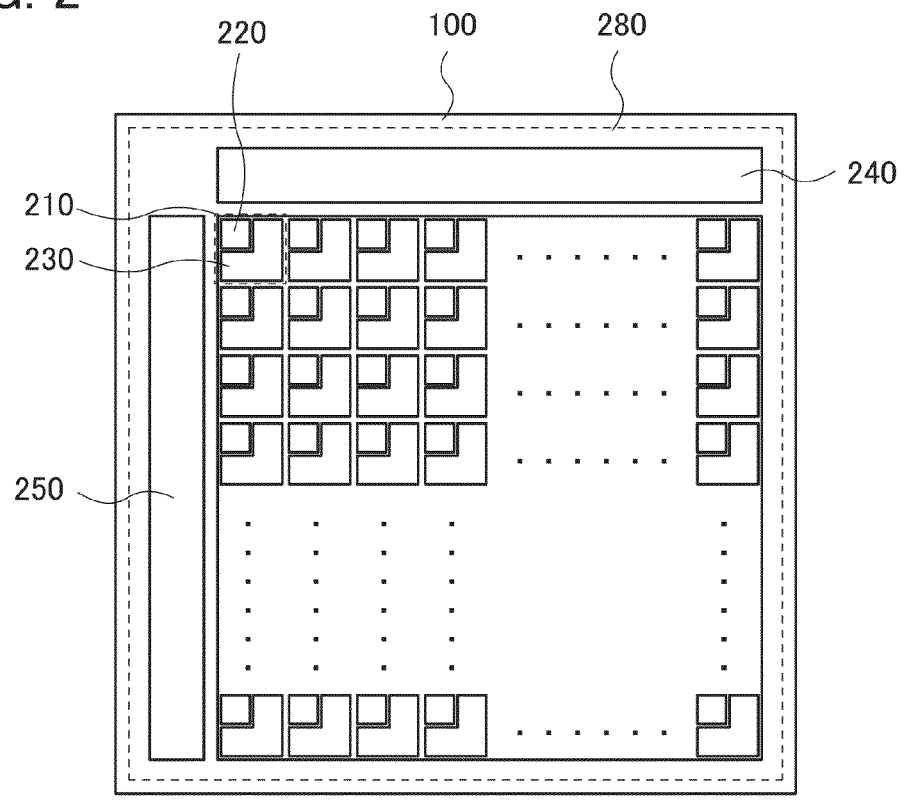
FIG. 2 illustrates an imaging device.

The transistor illustrated in FIG. 1 can be used in a pixel circuit 210 and either or both of a first circuit 240 and a second circuit 250 for driving the pixel circuit in an imaging device illustrated in FIG. 2. The pixel circuit 210 includes a light-receiving element 220 and a circuit portion 230 electrically connected to the light-receiving element.

In FIG. 2, the circuits for driving the pixel circuit 210 are positioned in two regions; however, the structure of the circuits is not limited thereto. For example, the circuits for driving the pixel circuit 210 can be collectively positioned in one region. Alternatively, the circuits for driving the pixel circuit 210 can be positioned in three or more separate regions. Further, the circuits for driving the pixel circuit 210 may be formed directly on the substrate 100 like a transistor included in the pixel circuit 210, or may be formed by mounting an IC chip on the substrate 100 by chip on glass (COG) or the like. Alternatively, a tape carrier package (TCP) or the like may be connected to the pixel circuit 210.

A scintillator 280 is formed over the pixel circuit 210. The scintillator 280 is formed of a substance that, when irradiated with radial rays such as X-rays or gamma-rays, absorbs energy of the radial rays to emit visible light or ultraviolet light or a material containing the substance. For example, materials such as $Gd_2O_2S:Tb$, $Gd_2O_2S:Pr$, $Gd_2O_2S:Eu$, BaF-Cl:Eu, NaI, CsI, $CaF_2$, $BaF_2$, $CeF_3$, LiF, LiI, and ZnO and a resin or ceramics in which any of the materials is dispersed are known. In FIG. 2, although the scintillator 280 is the uppermost surface, the scintillator 280 is shown transparently for easy understanding of components.

Radial rays such as X-rays which have penetrated an object enter the scintillator 280 and are converted to light (fluorescence) such as visible light or ultraviolet light. Then, the light is sensed by the light-receiving element 220 provided in the pixel circuit 210, whereby image data is obtained.

However, part of the radial rays that enters the scintillator 280 is not utilized for photoluminescence, and penetrates the scintillator 280. If a semiconductor material or an insulating material of the transistor is irradiated with radial rays such as X-rays, defect states and the like are generated in the irradiated portion, so that the electrical characteristics of the transistor are changed. This might increase power consumption of the imaging device or lower the reliability thereof.

For example, if a transistor including an oxide semiconductor in its channel formation region and including a single-layer silicon oxide film as a gate insulating film unlike one embodiment of the present invention is irradiated with intense X-rays in an accelerated test, the threshold voltage of the transistor shifts in the negative direction.

This phenomenon largely depends on a non-bridging oxygen hole center (NBOHC) in the silicon oxide film used as the gate insulating film.

It is known that X-ray irradiation of silicon oxide (e.g., $SiO_2$) generates two types of defects therein, which are an E' center and the NBOHC. The defect level of the NBOHC is located at a deep level on the valence band side.

Figure 3:
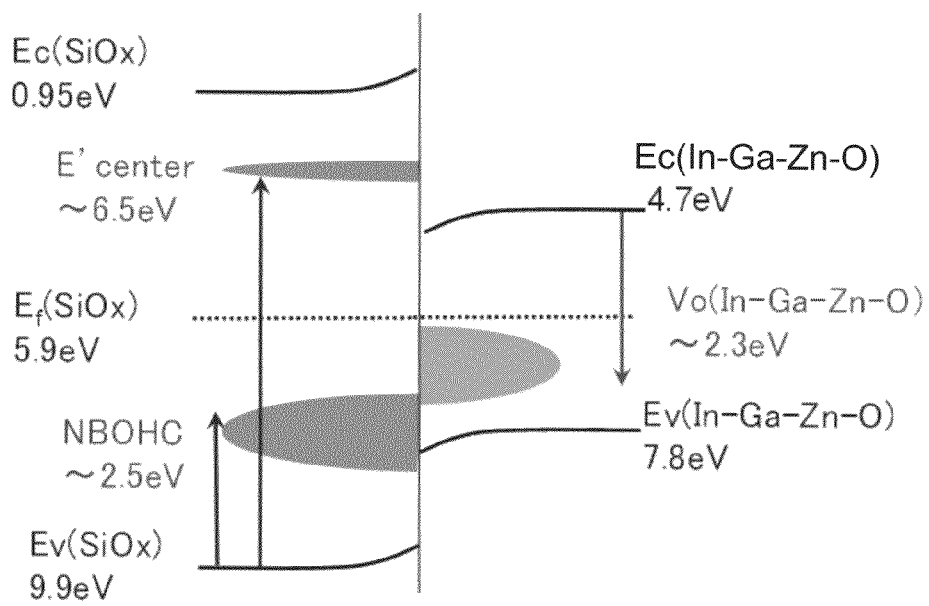
FIG. 3 shows a band diagram of an In—Ga—Zn oxide and silicon oxide.

FIG. 3 shows the estimated band diagram of silicon oxide and an In—Ga—Zn oxide in the case of using an In—Ga—Zn oxide as the oxide semiconductor in a channel formation region of a transistor. In FIG. 3, the defect level due to oxygen vacancies (Vo) of the In—Ga—Zn oxide and the like and the defect levels due to the E' center and the NBOHC of silicon oxide are also shown. In FIG. 3, Ev and Ec denote a valence band maximum and a conduction band minimum, respectively, and each value represents an energy value from the vacuum level. When the In—Ga—Zn oxide and silicon oxide are in contact with each other, the Fermi level of each film is assumed to be located at the center of the band gap. Note that in practice, the In—Ga—Zn oxide is likely to become n-type; therefore, in some cases, the Fermi level of the In—Ga—Zn oxide is located on the conduction band side.

As shown in FIG. 3, the defect levels of the In—Ga—Zn oxide and silicon oxide are located at deep levels of the valence bands which are extremely close to each other in energy. The following is a degradation model in X-ray irradiation made based on this band diagram.

First, by X-ray irradiation, an electron-hole is generated in the In—Ga—Zn oxide (an active layer of the transistor). Next, the generated hole is trapped in a deep defect state in the In—Ga—Zn oxide which is derived from an oxygen vacancy. Then, the trapped hole is injected into a defect state of the NBOHC in silicon oxide (the gate insulating film of the transistor). The injected hole serves as a fixed charge having a positive charge in silicon oxide, thereby changing the threshold voltage of the transistor.

Three factors that can be derived from the above model are generation of a hole by X-ray irradiation, a defect level in the In—Ga—Zn oxide, and a defect level in silicon oxide. It can be said that depending on these factors, the threshold voltage is changed.

To prevent this phenomenon in the transistor of one embodiment of the present invention, the first insulating film 131 of the silicon nitride film and the second insulating film 132 of the silicon oxide film constitute the gate insulating film 130.

In the silicon nitride film, a deep defect state like the above-described NBOHC is not generated; thus, one factor causing a change in the threshold voltage of the above-described model can be eliminated. However, it is not appropriate to singly use the silicon nitride film as a gate insulating film of a transistor using an oxide semiconductor layer including a channel formation region because the threshold voltage is changed by other factors. For example, a favorable interface is unlikely to be formed between the silicon nitride film and the oxide semiconductor layer, so that a fixed charge is likely to be held. Moreover, hydrogen contained in the silicon nitride film diffuses into the oxide semiconductor layer to be trapped in an oxygen vacancy and serves as a donor, making the n-type oxide semiconductor layer.

In view of the above, in one embodiment of the present invention, an ultrathin silicon oxide film is formed between the silicon nitride film and the oxide semiconductor layer. Although the silicon oxide film forms an NBOHC by X-ray irradiation like the silicon oxide film in the model described above, the absolute number of NBOHCs can be reduced and the number of injected holes can be limited by forming the silicon oxide film extremely thin. In this manner, a change in threshold voltage can be made extremely small.

Note that a silicon oxynitride film can also be used as the second insulating film 132. A silicon oxynitride in this specification means a compound of silicon, oxygen, and nitrogen where the oxygen content is larger than the nitrogen content, and can also be referred to as silicon oxide containing nitrogen.

The thickness of the first insulating film 131 formed of the silicon nitride film is preferably 100 nm to 400 nm, further preferably 200 nm to 300 nm. With the first insulating film 131 having the thickness within this range, the gate insulating film 130 can have favorable withstand voltage.

The thickness of the second insulating film 132 formed of the silicon oxide film is preferably 5 nm to 20 nm, further preferably 5 nm to 15 nm. With the second insulating film 132 having the thickness within this range, a change in the threshold voltage of the transistor can be made extremely small.

Figure 4:
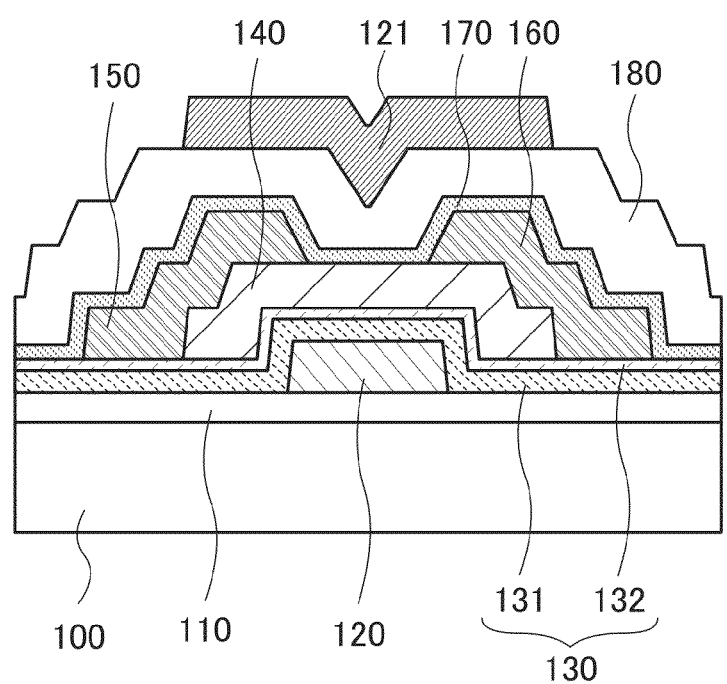
FIG. 4 is a cross-sectional view of a transistor.

The transistor of one embodiment of the present invention may include, as illustrated in FIG. 4, a conductive film 121 that overlaps with the gate electrode layer 120 and the oxide semiconductor layer 140 and is over the insulating layer 170 or the insulating layer 180. When the conductive film is used as a second gate electrode layer (back gate), the on-state current can be increased and the threshold voltage can be controlled. In order to increase the on-state current, for example, the gate electrode layer 120 and the conductive film 121 are set to have the same potential, and the transistor is driven as a dual-gate transistor. Further, to control the threshold voltage, a fixed potential that is different from a potential of the gate electrode layer 120 is supplied to the conductive film 121.

In this manner, an imaging device that is highly stable to irradiation with radial rays such as X-rays and can inhibit a decrease in electrical characteristics can be provided.

This embodiment can be implemented in appropriate combination with any of the structures described in the other embodiments or Example.

Embodiment 2

In this embodiment, a pixel circuit that can use the transistor described in Embodiment 1 will be described.

Figure 5A:
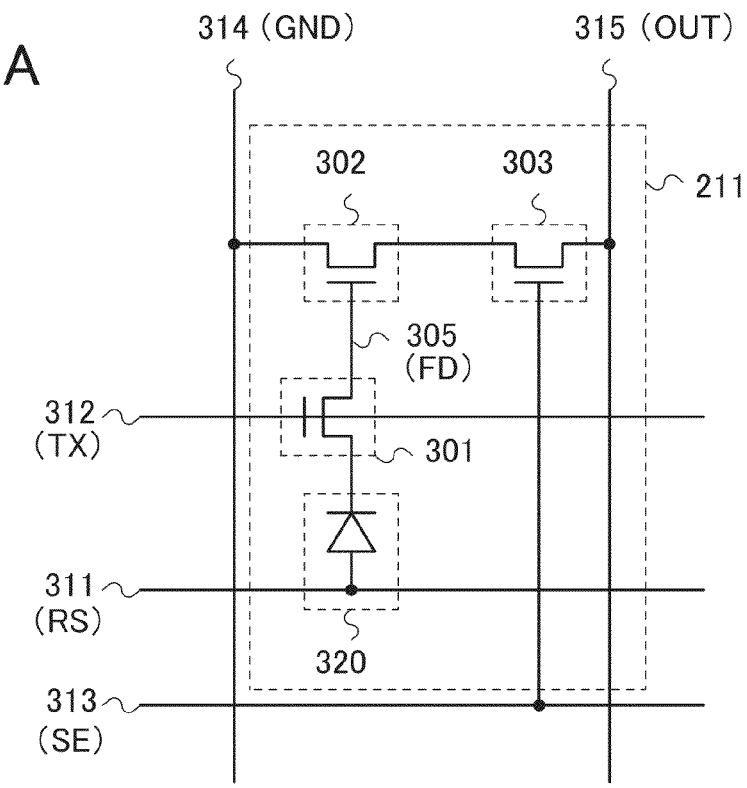
FIGS. 5A and 5B each illustrate a structure of a pixel circuit.

FIG. 5A shows an example of a circuit that can be used as the pixel circuit 210 illustrated in FIG. 2. A circuit 211 includes a photodiode 320 serving as the light-receiving element 220 and a first transistor 301, a second transistor 302, and a third transistor 303 that are provided in the circuit portion 230 connected to the light-receiving element.

An anode of the photodiode 320 is electrically connected to a first wiring 311 (RS); a cathode of the photodiode 320 is electrically connected to one of a source and a drain of the first transistor 301; the other of the source and the drain of the first transistor 301 is electrically connected to a wiring 305 (FD); a gate of the first transistor 301 is electrically connected to a second wiring 312 (TX); one of a source and a drain of the second transistor 302 is electrically connected to a fourth wiring 314 (GND); the other of the source and the drain of the second transistor 302 is electrically connected to one of a source and a drain of the third transistor 303; a gate of the second transistor 302 is electrically connected to the wiring 305 (FD); the other of the source and the drain of the third transistor 303 is electrically connected to a fifth wiring 315 (OUT); and a gate of the third transistor 303 is electrically connected to a third wiring 313 (SE).

The photodiode 320 is a light-receiving element and generates current corresponding to the amount of light incident on the pixel circuit. The first transistor 301 controls accumulation in the wiring 305 (FD) of electrical charges generated by the photodiode 320. The second transistor 302 outputs a signal corresponding to a potential of the wiring 305 (FD). The third transistor 303 is used to control selection of the pixel circuit at the time of reading.

Note that the wiring 305 (FD) is a charge accumulation portion retaining electrical charges whose amount changes depending on the amount of light received by the photodiode 320. Practically, the charge accumulation portion is depletion layer capacitance in the vicinity of a source region or a drain region of the first transistor 301 electrically connected to the wiring 305 (FD), wiring capacitance of the wiring 305 (FD), gate capacitance of the second transistor 302 electrically connected to the wiring 305 (FD), and the like.

The first wiring 311 (RS) is a signal line for resetting the wiring 305 (FD). The first wiring 311 (RS) in the circuit 211 is also a signal line for performing charge accumulation in the wiring 305 (FD). The second wiring 312 (TX) is a signal line for controlling the first transistor 301. The third wiring 313 (SE) is a signal line for controlling the third transistor 303. The fourth wiring 314 (GND) is a signal line for setting a reference potential (e.g., GND). The fifth wiring 315 (OUT) is a signal line for reading data obtained in the circuit 211.

Figure 5B:
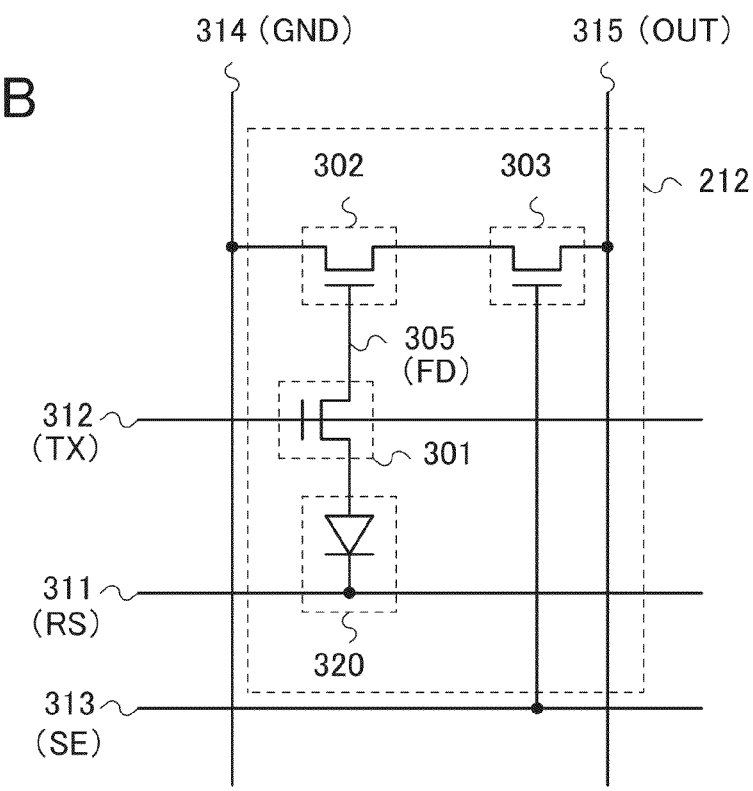

The pixel circuit 210 may have a configuration illustrated in FIG. 5B. A circuit 212 illustrated in FIG. 5B includes the same components as those in the circuit 211 in FIG. 5A but is different from the circuit 211 in that the anode of the photodiode 320 is electrically connected to one of the source and the drain of the first transistor 301 and the cathode of the photodiode 320 is electrically connected to the first wiring 311 (RS).

Next, a structure of each component illustrated in FIGS. 5A and 5B is described.

The photodiode 320 can be formed using a silicon semiconductor with a pn junction or a pin junction, for example. In the case where a scintillator emits visible light, a pin photodiode including an i-type semiconductor layer formed of amorphous silicon is preferably used. Since amorphous silicon has high sensitivity in a visible light wavelength region, weak visible light can be sensed easily.

Note that an i-type semiconductor refers not only to what is called an intrinsic semiconductor in which the Fermi level lies in the middle of the band gap, but also to a semiconductor in which the concentration of an impurity imparting p-type conductivity and the concentration of an impurity imparting n-type conductivity are less than or equal to $1 \times 10^{20}$ atoms/$cm^3$ and in which the photoconductivity is higher than the dark conductivity.

Although a silicon semiconductor such as amorphous silicon, microcrystalline silicon, polycrystalline silicon, or single crystal silicon can be used to form the first transistor 301, the second transistor 302, and the third transistor 303, an oxide semiconductor is preferably used to form the transistors. A transistor in which a channel formation region is formed of an oxide semiconductor has an extremely low off-state current.

In particular, when the first transistor 301 connected to the wiring 305 (FD) has a large leakage current, electrical charges accumulated in the wiring 305 (FD) cannot be retained for a sufficiently long time. When the first transistor 301 is formed using an oxide semiconductor, unwanted output of electrical charges through the photodiode can be prevented.

Unwanted output of electrical charges also occurs in the fourth wiring 314 or the fifth wiring 315 when the second transistor 302 and the third transistor 303 have a large leakage current; thus, transistors in which a channel formation region is formed of an oxide semiconductor are preferably used as these transistors.

When the transistor using an oxide semiconductor with an extremely small off-state current is used as the second transistor 302, imaging can be performed with wider dynamic range. In the pixel circuit illustrated in FIG. 5A, a gate potential of the second transistor 302 is decreased when the intensity of light incident on the photodiode 320 is increased. In the pixel circuit illustrated in FIG. 5B, the gate potential of the second transistor 302 is decreased when the intensity of light incident on the photodiode 320 is decreased. Since the transistor using an oxide semiconductor has an extremely small off-state current, a current corresponding to the gate potential can be accurately output even when the gate potential is extremely low. Thus, it is possible to broaden the detection range of illuminance, i.e., the dynamic range.

Further, in the pixel circuit illustrated in FIG. 5B, sufficiently wide dynamic range can be obtained even when the gate potential of the second transistor 302 is relatively low, i.e., when the intensity of light emitted from the scintillator to the photodiode is low. In other words, the scintillator does not need to emit high-intensity light, which makes it possible to reduce the intensity of X-rays emitted to an object.

Next, an example of the operation of the circuit 211 in FIG. 5A is described with reference to a timing chart in FIG. 6A.

In FIG. 6A, a signal which varies between two levels is applied to each wiring, for simplicity. Note that in practice, the potential can have various levels depending on circumstances without being limited to two levels because the signal is an analog signal. In the drawing, a signal 401 corresponds to a potential of the first wiring 311 (RS); a signal 402, a potential of the second wiring 312 (TX); a signal 403, a potential of the third wiring 313 (SE); a signal 404, a potential of the wiring 305 (FD); and a signal 405, a potential of the fifth wiring 315 (OUT).

At time A, the potential of the first wiring 311 (signal 401) is set high and the potential of the second wiring 312 (signal 402) is set high, whereby a forward bias is applied to the photodiode 320 and the potential of the wiring 305 (signal 404) is set high. In other words, the potential of the charge accumulation portion is initialized to the potential of the first wiring 311 and brought into a reset state. The above is the start of a reset operation. Note that the potential of the fifth wiring 315 (signal 405) is precharged to high level.

At time B, the potential of the first wiring 311 (signal 401) is set low and the potential of the second wiring 312 (signal 402) is set high, so that the reset operation is terminated and an accumulation operation starts. Here, a reverse bias is applied to the photodiode 320, whereby the potential of the wiring 305 (signal 404) starts to decrease due to a reverse current. Since irradiation of the photodiode 320 with light increases the reverse current, the rate of decrease in the potential of the wiring 305 (signal 404) changes depending on the amount of the light irradiation. In other words, channel resistance between the source and the drain of the second transistor 302 changes depending on the amount of light emitted to the photodiode 320.

Note that the light emitted to the photodiode 320 refers to the light which is converted from radial rays such as X-rays by the scintillator.

At time C, the potential of the second wiring 312 (signal 402) is set low to terminate the accumulation operation, so that the potential of the wiring 305 (signal 404) becomes constant. Here, the potential is determined by the number of electrical charges generated by the photodiode 320 during the accumulation operation. That is, the potential changes depending on the amount of light emitted to the photodiode 320. Further, since the first transistor 301 is a transistor including a channel formation region in an oxide semiconductor layer, which has an extremely low off-state current, the potential of the wiring 305 can be kept constant until a subsequent selection operation (read operation) is performed.

Note that when the potential of the second wiring 312 (signal 402) is set low, the potential of the wiring 305 changes due to parasitic capacitance between the second wiring 312 and the wiring 305 in some cases. In the case where this potential change is large, the number of electrical charges generated by the photodiode 320 during the accumulation operation cannot be obtained accurately. Examples of effective measures to decrease the potential change include reducing the capacitance between the gate and the source (or between the gate and the drain) of the first transistor 301, increasing the gate capacitance of the second transistor 302, and providing a storage capacitor connected to the wiring 305. Note that in this embodiment, the potential change can become negligible by the adoption of these measures.

At time D, the potential of the third wiring 313 (signal 403) is set high to turn on the third transistor 303, whereby the selection operation starts and the fourth wiring 314 and the fifth wiring 315 are electrically connected to each other through the second transistor 302 and the third transistor 303. Also, the potential of the fifth wiring 315 (signal 405) starts to decrease. Note that precharge of the fifth wiring 315 is terminated before time D. Here, the rate of decrease in the potential of the fifth wiring 315 (signal 405) depends on the current between the source and the drain of the second transistor 302. That is, the rate of decrease changes depending on the amount of light emitted to the photodiode 320 during the accumulation operation.

At time E, the potential of the third wiring 313 (signal 403) is set low to turn off the third transistor 303, so that the selection operation is terminated and the potential of the fifth wiring 315 (signal 405) becomes a constant value. Here, the constant value depends on the amount of light emitted to the photodiode 320. Therefore, the amount of light emitted to the photodiode 320 during the accumulation operation can be known by obtaining the potential of the fifth wiring 315.

Specifically, the stronger the light emitted to the photodiode 320 is, the lower the potential of the wiring 305 is and the lower a gate voltage of the second transistor 302 is, resulting in a gradual decrease in the potential of the fifth wiring 315 (signal 405). Thus, a relatively high potential can be read from the fifth wiring 315.

Conversely, the weaker the light emitted to the photodiode 320 is, the higher the potential of the wiring 305 is and the higher the gate voltage of the second transistor 302 is, resulting in a rapid decrease in the potential of the fifth wiring 315 (signal 405). Thus, a relatively low potential can be read from the fifth wiring 315.

Next, an example of the operation of the circuit 212 in FIG. 5B is described with reference to a timing chart in FIG. 6B.

At time A, the potential of the first wiring 311 (signal 401) is set low and the potential of the second wiring 312 (signal 402) is set high, whereby a forward bias is applied to the photodiode 320 and the potential of the wiring 305 (signal 404) is set low. In other words, the potential of the charge accumulation portion is brought into a reset state. The above is the start of a reset operation. Note that the potential of the fifth wiring 315 (signal 405) is precharged to high level.

At time B, the potential of the first wiring 311 (signal 401) is set high and the potential of the second wiring 312 (signal 402) is set high, so that the reset operation is terminated and an accumulation operation starts. Here, a reverse bias is applied to the photodiode 320, whereby the potential of the wiring 305 (signal 404) starts to increase due to a reverse current. Since irradiation of the photodiode 320 with light increases the reverse current, the rate of increase in the potential of the wiring 305 (signal 404) changes depending on the amount of the light irradiation. In other words, channel resistance between the source and the drain of the second transistor 302 changes depending on the amount of light emitted to the photodiode 320.

The description of the timing chart of FIG. 6A can be referred to for operations at and after time C. The amount of light emitted to the photodiode 320 during the accumulation operation can be known by obtaining the potential of the fifth wiring 315 at time E.

Figure 7A:
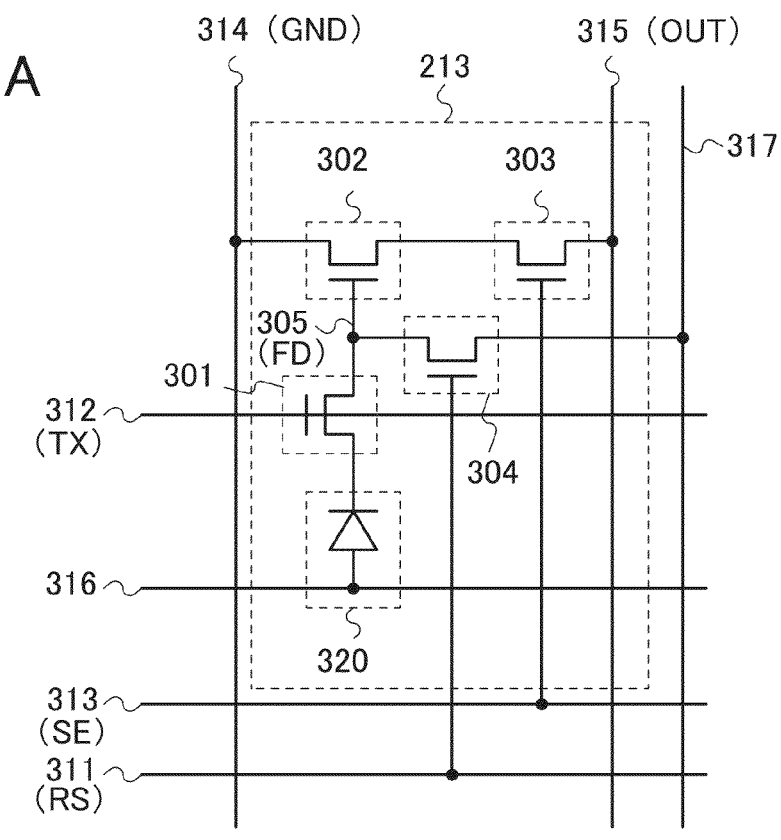
FIGS. 7A and 7B each illustrate a structure of a pixel circuit.
Figure 7B:
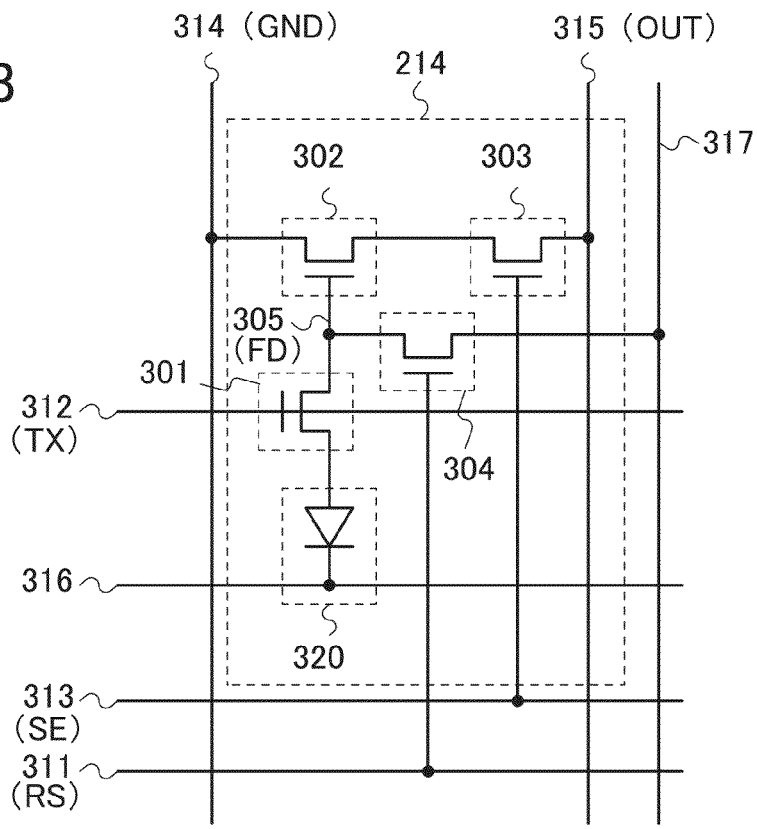

Further, the pixel circuit 210 may have a configuration illustrated in FIG. 7A or FIG. 7B.

A circuit 213 illustrated in FIG. 7A has a configuration in which a fourth transistor 304 is added to the circuit 211 in FIG. 5A. A gate of the transistor is electrically connected to the first wiring 311; one of a source and a drain of the transistor is electrically connected to the wiring 305 (FD); the other of the source and the drain of the transistor is electrically connected to a seventh wiring 317; and the anode of the photodiode 320 is electrically connected to a sixth wiring 316. Here, the sixth wiring 316 is a signal line (low potential line) for applying a reverse bias to the photodiode 320 all the time. The seventh wiring 317 is a signal line (high potential line) for resetting the wiring 305 to a high potential.

The fourth transistor 304 serves as a reset transistor for resetting the wiring 305 (FD). Hence, unlike in the circuit 211 in FIG. 5A, the reset operation using the photodiode 320 is not performed and a reverse bias is applied to the photodiode all the time. The wiring 305 (FD) can be reset by setting the potential of the first wiring 311 (RS) high. Operations of the circuit 213 are the same as those of the circuit 211 in FIG. 5A, which are illustrated in the timing chart in FIG. 6A.

A circuit 214 illustrated in FIG. 7B has a configuration in which the fourth transistor 304 is added to the circuit 212 in FIG. 5B. The gate of the transistor is electrically connected to the first wiring 311; one of the source and the drain of the transistor is electrically connected to the wiring 305 (FD); the other of the source and the drain of the transistor is electrically connected to the seventh wiring 317; and the cathode of the photodiode 320 is electrically connected to the sixth wiring 316. Here, the sixth wiring 316 is a signal line (high potential line) for applying a reverse bias to the photodiode 320 all the time. The seventh wiring 317 is a signal line (low potential line) for resetting the wiring 305 to a low potential.

The fourth transistor 304 serves as a reset transistor for resetting the wiring 305 (FD). Hence, unlike in the circuit 212 in FIG. 5B, the reset operation using the photodiode 320 is not performed and a reverse bias is applied to the photodiode all the time. The wiring 305 (FD) can be reset by setting the potential of the first wiring 311 (RS) high. The circuit 214 can operate in accordance with a timing chart in FIG. 6C.

The fourth transistor 304 can be formed using a silicon semiconductor such as amorphous silicon, microcrystalline silicon, polycrystalline silicon, or single crystal silicon; however, when the fourth transistor 304 has a large leakage current, electrical charges cannot be retained in the charge accumulation portion for a sufficiently long time. For this reason, a transistor formed using an oxide semiconductor with an extremely low off-state current is preferably used as the fourth transistor 304, as in the case of the first transistor 301.

Figure 8:
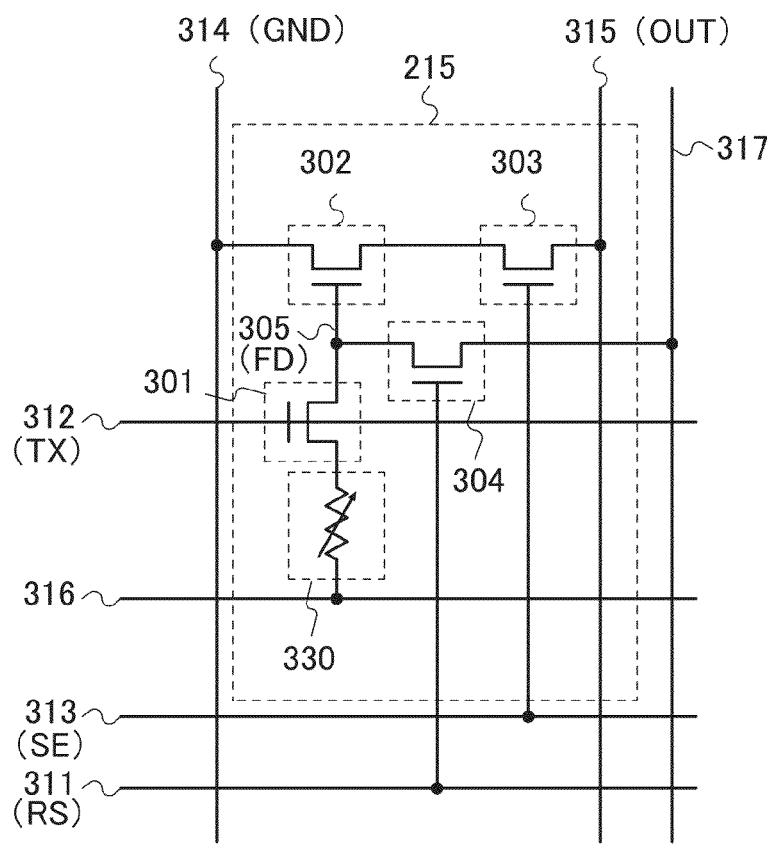
FIG. 8 illustrates a structure of a pixel circuit.

Further, the pixel circuit 210 may have a configuration illustrated in FIG. 8. A circuit 215 in FIG. 8 has the same configuration as that in FIG. 5A or FIG. 5B except that a variable resistive element 330 is used instead of the photodiode as a light-receiving element. For the variable resistive element, a pair of electrodes and an i-type semiconductor layer provided between the pair of electrodes can be used.

For example, the resistance changes due to visible light irradiation when an i-type amorphous silicon layer is used as the semiconductor layer; thus, the potential of the wiring 305 can be changed as in the case of using the photodiode, which enables the amount of light emitted to the variable resistive element 330 during the accumulation operation to be known. Further, as the i-type semiconductor layer, an oxide semiconductor layer having a band gap of 3 eV or more may be used. Since the resistance of the oxide semiconductor layer changes due to ultraviolet light irradiation, the potential of the wiring 305 can be changed, which enables the amount of light emitted to the variable resistive element 330 during the accumulation operation to be known. In order to select the wavelength of the light emitted to the variable resistive element 330, the type of the scintillator 280 may be changed.

By setting the potential of the sixth wiring 316 low and the potential of the seventh wiring 317 high, the circuit 215 in FIG. 8 can operate in accordance with the timing chart in FIG. 6A. Further, by setting the potential of the sixth wiring 316 high and the potential of the seventh wiring 317 low, the circuit 215 can operate in accordance with the timing chart in FIG. 6C.

Figure 9A:
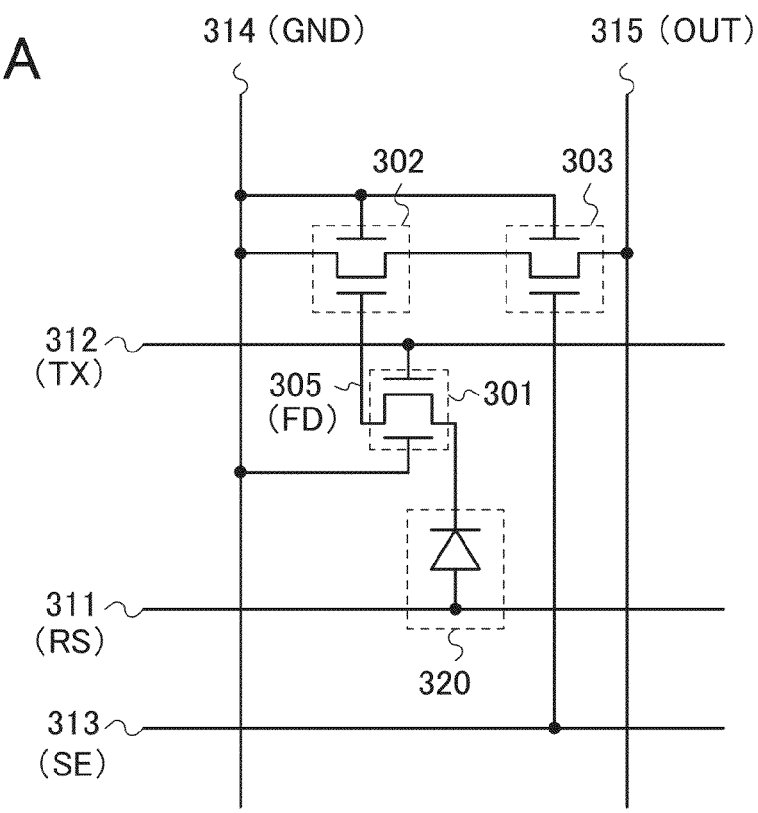
FIGS. 9A and 9B each illustrate a structure of a pixel circuit.
Figure 9B:
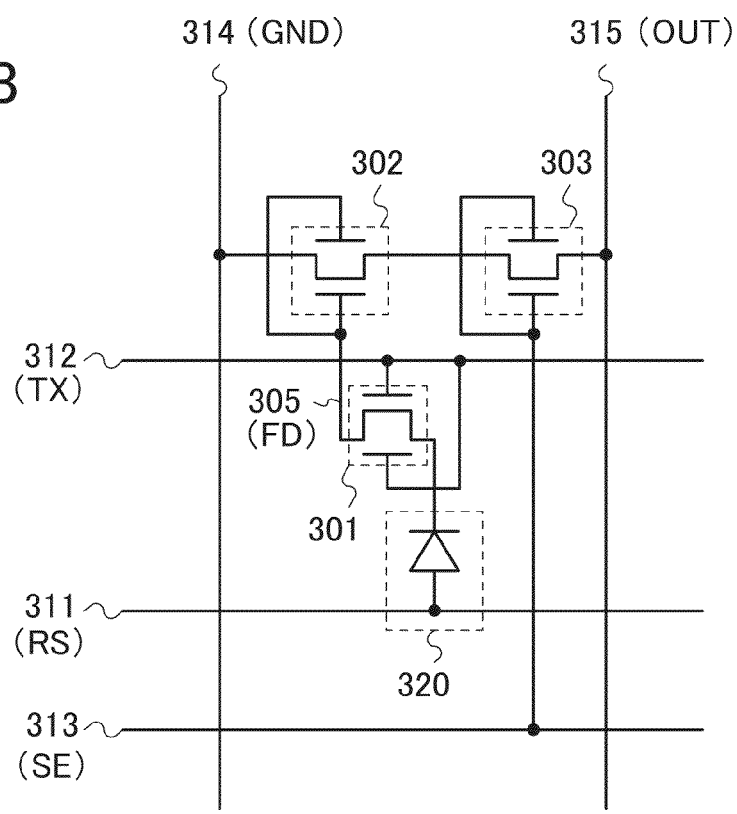

The first transistor 301, the second transistor 302, and the third transistor 303 in the pixel circuit 210 may have back gates as illustrated in FIGS. 9A and 9B. FIG. 9A illustrates a configuration of applying a constant potential to the back gates, which enables control of the threshold voltages. FIG. 9B illustrates a configuration in which the back gates are applied with the same potential as their respective front gates, which enables an increase in on-state current. Although the back gates are electrically connected to the fourth wiring 314 (GND) in the configuration of FIG. 9A, they may be electrically connected to a different wiring to which a constant potential is supplied. Furthermore, although back gates are provided in the transistors of the circuit 211 in FIGS. 9A and 9B, back gates may also be provided in the circuit 212, the circuit 213, and the circuit 214. Moreover, the configuration of applying the same potential to a front gate and a back gate, the configuration of applying a constant potential to a back gate, and the configuration without a back gate may be arbitrarily combined as necessary for the transistors in one pixel circuit.

Figure 10A:
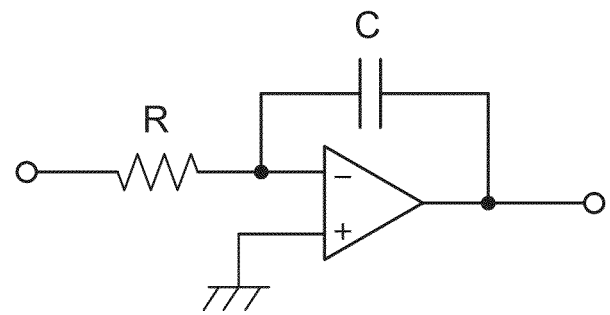
FIGS. 10A to 10C each illustrate an integrator circuit.
Figure 10B:
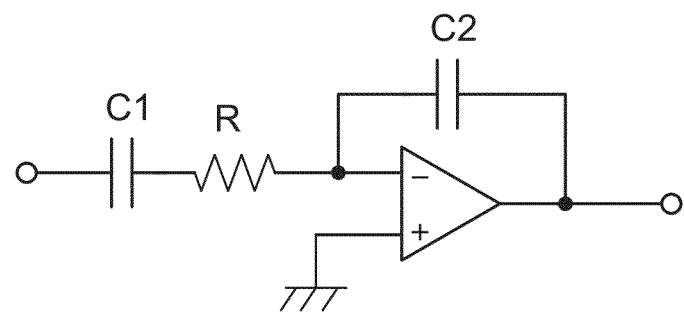
Figure 10C:
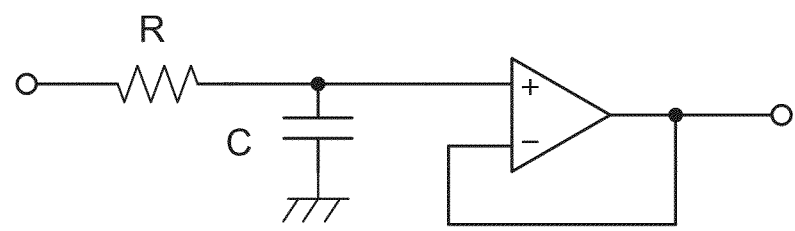

Note that in the circuit example, an integrator circuit illustrated in FIG. 10A, 10B, or 10C may be connected to the fifth wiring 315 (OUT). The circuit enables an S/N ratio of a reading signal to be increased, which makes it possible to sense weaker light, that is, to increase the sensitivity of the imaging device.

FIG. 10A illustrates an integrator circuit using an operational amplifier circuit (also referred to as an op-amp). An inverting input terminal of the operational amplifier circuit is connected to the fifth wiring 315 (OUT) through a resistor R. A non-inverting input terminal of the operational amplifier circuit is grounded. An output terminal of the operational amplifier circuit is connected to the inverting input terminal of the operational amplifier circuit through a capacitor C.

Here, the operational amplifier circuit is assumed to be an ideal operational amplifier circuit. In other words, it is assumed that input impedance is infinite (the input terminals draw no current). Since the potential of the non-inverting input terminal and the potential of the inverting input terminal are equal in a steady state, the potential of the inverting input terminal can be considered as a ground potential.

Equations (1) to (3) are satisfied, where Vi is the potential of the fifth wiring 315, Vo is the potential of the output terminal of the operational amplifier circuit, i1 is a current flowing through the resistor R, and i2 is a current flowing through the capacitor C.

$$Vi = i1 \cdot R \quad (1)$$

$$i2 = C \cdot dVo/dt \quad (2)$$

$$i1 + i2 = 0 \quad (3)$$

Here, when electrical charges in the capacitor C are discharged at the time t=0, the potential Vo of the output terminal of the operational amplifier circuit at the time t=t is expressed by Equation (4).

$$Vo=-(1/CR)\int Vidt \quad (4)$$

In other words, with a longer time t (integral time), the potential (Vi) to be read can be raised and output as the output signal Vo. Moreover, lengthening of the time t also means averaging of thermal noise or the like and can increase an S/N ratio of the output signal Vo.

In a real operational amplifier circuit, a bias current flows even when a signal is not input to the input terminals, so that an output voltage is generated at the output terminal and electrical charges are accumulated in the capacitor C. It is therefore effective to connect a resistor in parallel with the capacitor C so that the capacitor C can be discharged.

FIG. 10B illustrates an integrator circuit including an operational amplifier circuit having a structure different from that in FIG. 10A. An inverting input terminal of the operational amplifier circuit is connected to the fifth wiring 315 (OUT) through a resistor R and a capacitor C1. A non-inverting input terminal of the operational amplifier circuit is grounded. An output terminal of the operational amplifier circuit is connected to the inverting input terminal of the operational amplifier circuit through a capacitor C2.

Here, the operational amplifier circuit is assumed to be an ideal operational amplifier circuit. In other words, it is assumed that input impedance is infinite (the input terminals draw no current). Since the potential of the non-inverting input terminal and the potential of the inverting input terminal are equal in a steady state, the potential of the inverting input terminal can be considered as a ground potential.

Equations (5) to (7) are satisfied, where Vi is the potential of the fifth wiring 315, Vo is the potential of the output terminal of the operational amplifier circuit, i1 is a current flowing through the resistor R and the capacitor C1, and i2 is a current flowing through the capacitor C2.

$$Vi=(1/C1)\int i1 dt + i1 \cdot R \quad (5)$$

$$i2=C2 \cdot dVo/dt \quad (6)$$

$$i1+i2=0 \quad (7)$$

Here, assuming that charges in the capacitor C2 are discharged at the time t=0, the potential Vo of the output terminal of the operational amplifier circuit at the time t=t is expressed by (9) when (8) is satisfied, which corresponds to a high-frequency component, and (11) when (10) is satisfied, which corresponds to a low-frequency component.

$$Vo<<dVo/dt \quad (8)$$

$$Vo=-(1/C2R)\int Vidt \quad (9)$$

$$Vo>>dVo/dt \quad (10)$$

$$Vo=-C1/C2 \cdot Vi \quad (11)$$

In other words, by appropriately setting the capacitance ratio of the capacitor C1 to the capacitor C2, the potential (Vi) to be read can be raised and output as the output signal Vo. Further, a high-frequency noise component of the input signal can be averaged by time integration, and an S/N ratio of the output signal Vo can be increased.

In a real operational amplifier circuit, a bias current flows even when a signal is not input to the input terminals, so that an output voltage is generated at the output terminal and electrical charges are accumulated in the capacitor C2. It is thus effective to connect a resistor in parallel with the capacitor C2 so that the capacitor C2 can be discharged.

FIG. 10C illustrates an integrator circuit using an operational amplifier circuit having a structure different from those in FIGS. 10A and 10B. A non-inverting input terminal of the operational amplifier circuit is connected to the fifth wiring 315 (OUT) through a resistor R and is grounded through a capacitor C. An output terminal of the operational amplifier circuit is connected to an inverting input terminal of the operational amplifier circuit. The resistor R and the capacitor C constitute a CR integrator circuit. The operational amplifier circuit is a unity gain buffer.

When Vi is the potential of the fifth wiring 315 and Vo is the potential of the output terminal of the operational amplifier circuit, Vo can be expressed by Equation (12). Although Vo is saturated at the value of Vi, a noise component included in the input signal Vi can be averaged by the CR integrator circuit, and as a result, an S/N ratio of the output signal Vo can be increased.

$$Vo=(1/CR)\int Vidt \quad (12)$$

This embodiment can be implemented in appropriate combination with any of the structures described in the other embodiments and Example.

Embodiment 3

In this embodiment, an example of a driving method of the pixel circuit described in Embodiment 2 is described.

As described in Embodiment 2, the operation of the pixel circuit is repetition of the reset operation, the accumulation operation, and the selection operation. In the imaging device using radial rays such as X-rays, radiation exposure time is preferably as short as possible in consideration of influence of radial rays on the living body. To shorten the radiation irradiation time and perform imaging in short time, it is necessary to perform the reset operation, the accumulation operation, and the selection operation of all the pixel circuits at high speed.

Thus, a driving method using a global shutter system illustrated in a timing chart in FIG. 11A is preferably used for imaging. Note that FIG. 11A shows operations of the imaging device in which a plurality of pixel circuits 211 illustrated in FIG. 5A are arranged in a matrix, specifically, operations of the circuits 211 from the first row to the third row of the first to last rows. The operation described below can be applied to the circuit 213 in FIG. 7A, the circuit 215 in FIG. 8, and the circuits in FIGS. 9A and 9B.

In FIG. 11A, a signal 501, a signal 502, and a signal 503 are signals input to the first wirings 311 (RS) connected to the pixel circuits in the first row, the second row, and the third row, respectively. A signal 504, a signal 505, and a signal 506 are signals input to the second wirings 312 (TX) connected to the pixel circuits in the first row, the second row, and the third row, respectively. A signal 507, a signal 508, and a signal 509 are signals input to the third wirings 313 (SE) connected to the pixel circuits in the first row, the second row, and the third row, respectively.

A period 510 is a period required for one imaging. In a period 511, the pixel circuits in each row perform the reset operation at the same time. In a period 520, the pixel circuits in each row perform the accumulation operation at the same time. The selection operation of the pixel circuits is sequentially performed on the row basis. For example, a period 531 is a period for performing the selection operation in the pixel circuits in the first row. In this manner, in the global shutter system, the reset operation is performed in all the pixel circuits substantially at the same time, the accumulation operation is performed in all the pixel circuits substantially at the same time, and then the read operation is sequentially performed on the row basis.

That is, in the global shutter system, since the accumulation operation is performed in all the pixel circuits substantially at the same time, imaging is simultaneously performed in the pixel circuits in all the rows. Thus, radiation irradiation in synchronization with the accumulation operation can shorten the radiation irradiation time of an object. That is, the radiation irradiation is performed only in the period 520.

FIG. 11B is a timing chart of the case where a rolling shutter system is used. A period 610 is a period required for one imaging. A period 611, a period 612, and a period 613 are reset periods in the first row, the second row, and the third row, respectively. A period 621, a period 622, and a period 623 are accumulation operation periods in the first row, the second row, and the third row, respectively. In a period 631, the selection operation is performed in the pixel circuits in the first row. As described above, in the rolling shutter system, the accumulation operation is not performed at the same time in all the pixel circuits but is sequentially performed on the row basis; thus, imaging is not simultaneously performed in the pixel circuits in all the rows. For this reason, even when the radiation irradiation is synchronized with the accumulation operation, a radiation irradiation period 620 is longer than the period in the global shutter system. However, by performing operations at high speed, a radiation irradiation period can be shortened even in the rolling shutter system; thus, the rolling shutter system can be used as a driving method of the imaging device of one embodiment of the present invention.

To realize the global shutter system, even after the accumulation operation, the potential of the wiring 305 (FD) in each pixel circuit needs to be kept for a long time until the read operation is performed. As described above, when a transistor including a channel formation region formed of an oxide semiconductor, which has an extremely low off-state current, is used as the first transistor 301, the potential of the wiring 305 (FD) can be kept for a long time. In the case where a transistor including a channel formation region formed of a silicon semiconductor or the like is used as the first transistor 301, the potential of the wiring 305 (FD) cannot be kept for a long time because of a high off-state current, which makes it difficult to use the global shutter system.

As described above, the use of transistors including a channel formation region formed of an oxide semiconductor in the pixel circuits makes it easy to realize the global shutter system; accordingly, the imaging device that allows for low dose of radiation emitted to an object can be provided.

This embodiment can be implemented in appropriate combination with any of the structures described in the other embodiments and Example.

Embodiment 4

In this embodiment, a layout example of the pixel circuit is described with reference to FIGS. 12A and 12B.

FIG. 12A is a top view of the circuit 211 illustrated in FIG. 5A and FIG. 12B is a cross-sectional view taken along the dashed-dotted line E1-E2 in FIG. 12A.

The circuit 211 includes a conductive film 1211 serving as the first wiring 311 (RS), a conductive film 1212 serving as the second wiring 312 (TX), a conductive film 1213 serving as the third wiring 313 (SE), a conductive film 1214 serving as the fourth wiring 314 (GND), and a conductive film 1215 serving as the fifth wiring 315 (OUT).

The photodiode 320 included in the circuit 211 includes a p-type semiconductor film 415, an i-type semiconductor film 416, and an n-type semiconductor film 417 which are stacked in this order. The conductive film 1211 is electrically connected to the p-type semiconductor film 415 serving as the anode of the photodiode 320.

A conductive film 1218 included in the circuit 211 serves as a gate electrode of the first transistor 301 and is electrically connected to the conductive film 1212. A conductive film 1219 included in the circuit 211 serves as one of a source electrode and a drain electrode of the first transistor 301. A conductive film 1220 included in the circuit 211 serves as the other of the source electrode and the drain electrode of the first transistor 301. A conductive film 1221 included in the circuit 211 is electrically connected to the n-type semiconductor film 417 and the conductive film 1219. A conductive film 1222 included in the circuit 211 serves as a gate electrode of the second transistor 302 and is electrically connected to the conductive film 1220.

A conductive film 1223 included in the circuit 211 serves as one of a source electrode and a drain electrode of the second transistor 302. A conductive film 1224 included in the circuit 211 serves as the other of the source electrode and the drain electrode of the second transistor 302 and one of a source electrode and a drain electrode of the third transistor 303. The conductive film 1214 serves as the other of the source electrode and the drain electrode of the third transistor 303. The conductive film 1213 also serves as a gate electrode of the third transistor 303. A conductive film 1225 included in the circuit 211 is electrically connected to the conductive film 1223 and the conductive film 1214.

In FIGS. 12A and 12B, a conductive film 1226 included in the circuit 211 is electrically connected to the conductive film 1211 serving as the first wiring 311 (RS). A conductive film 1227 included in the circuit 211 is electrically connected to the conductive film 1212 serving as the second wiring 312 (TX).

The conductive films 1213, 1218, 1222, 1225, 1226, and 1227 can be formed by processing one conductive film formed over an insulating surface into desired shapes. A gate insulating film 1228 is formed over the conductive films 1213, 1218, 1222, 1225, 1226, and 1227. The conductive films 1211, 1212, 1214, 1215, 1219, 1220, 1223, and 1224 can be formed by processing one conductive film formed over the gate insulating film 1228 into desired shapes.

An insulating film 1281 and an insulating film 1282 are formed over the conductive films 1211, 1212, 1214, 1215, 1219, 1220, 1223, and 1224. The conductive film 1221 is formed over the insulating film 1281 and the insulating film 1282.

An oxide semiconductor is preferably used for a semiconductor layer 1250 of the first transistor 301. In order that electrical charges generated by irradiation of the photodiode 320 with light are retained for a long time, the first transistor 301 electrically connected to the charge accumulation portion needs to be a transistor with an extremely low off-state current. Thus, the use of an oxide semiconductor material as the semiconductor layer 1250 improves the performance of the circuit 211. Note that the charge accumulation portion is the wiring 305 in the circuit 211 and corresponds to the conductive film 1220 in FIGS. 12A and 12B. The second transistor 302 and the third transistor 303 can also have a structure similar to that of the first transistor 301.

Further, the circuit 211 may have a configuration in which an element such as a transistor overlaps with the photodiode 320 as illustrated in FIGS. 13A and 13B. Such a configuration increases the density of pixels and the resolution of the imaging device. In addition, the area of the photodiode 320 can be increased, resulting in an increase in the sensitivity of the imaging device. FIG. 13A is a top view of the circuit 211 and FIG. 13B is a cross-sectional view taken along the dashed-dotted line F1-F2 in FIG. 13A.

In the circuit 211 illustrated in FIGS. 13A and 13B, conductive film 1219 serving as one of the source electrode and the drain electrode of the first transistor 301 is electrically connected to the n-type semiconductor film 417 serving as the cathode of the photodiode 320 through a conductive film 1229. The p-type semiconductor film 415 serving as the anode of the photodiode 320 is electrically connected to the conductive film 1226 in contact with the first wiring 311, through the conductive film 1221. An insulating film 1283 is formed to protect the photodiode 320. Except for these points and the overlapping structure of the element such as the transistor and the photodiode 320, the configuration of the circuit in FIGS. 13A and 13B is similar to that of the pixel circuit 211 in FIGS. 12A and 12B.

Note that although a configuration in which the p-type semiconductor film 415 is directly electrically connected to the conductive film 1226 through the conductive film 1221 is shown as an example, another conductive film electrically connected to the conductive film 1226 through an opening formed in the insulating films 1281, 1282, and 1283 may be provided to be electrically connected to the conductive film 1221.

The overlapping structure of an element such as a transistor and a light-receiving element such as a photodiode as illustrated in FIGS. 13A and 13B can be applied to the circuit 212 illustrated in FIG. 5B, the circuits 213 and 214 illustrated in FIGS. 7A and 7B, the circuit 215 illustrated in FIG. 8, and the circuits illustrated in FIGS. 9A and 9B.

This embodiment can be implemented in appropriate combination with any of the structures described in the other embodiments and Example.

Embodiment 5

In this embodiment, a transistor with an extremely low off-state current, which can be used for any of the circuits described in Embodiments 1 to 4, and a material for the transistor are described.

Although the transistor having a channel-etched bottom-gate structure is shown as an example in FIG. 1 and FIG. 4, the transistor may have a channel-protective bottom-gate structure, a non-self-aligned top-gate structure, or a self-aligned top-gate structure.

To form the transistor with an extremely low off-state current, a semiconductor material (e.g., oxide semiconductor) having a wider band gap than a silicon semiconductor and lower intrinsic carrier density than silicon is preferably used for the semiconductor layer.

As one example of the semiconductor material, a compound semiconductor such as silicon carbide (SiC) or gallium nitride (GaN) can be given in addition to an oxide semiconductor. The oxide semiconductor has an advantage of high mass productivity because the oxide semiconductor can be formed by a sputtering method or a wet process, unlike silicon carbide or gallium nitride. Further, the oxide semiconductor can be formed even at room temperature; thus, the oxide semiconductor can be formed over a glass substrate or over an integrated circuit using silicon. Further, a larger substrate can be used. Accordingly, among the semiconductors with wide band gaps, the oxide semiconductor particularly has an advantage of high mass productivity. Further, in the case where an oxide semiconductor with high crystallinity is to be obtained in order to improve the property of a transistor (e.g., field-effect mobility), the oxide semiconductor with crystallinity can be easily obtained by heat treatment at 250° C. to 800° C.

Further, the conductivity type of a highly purified oxide semiconductor (purified OS) obtained by reduction of impurities each of which serves as an electron donor (donor) and by reduction of oxygen vacancies is an i-type or a substantially i-type. Therefore, a transistor including the oxide semiconductor has a characteristic of an extremely low off-state current. Furthermore, the band gap of the oxide semiconductor is 2 eV or more, preferably 2.5 eV or more, further preferably 3 eV or more. With the use of an oxide semiconductor film which is highly purified by a sufficient decrease in the concentration of impurities such as moisture or hydrogen and reduction of oxygen vacancies, the off-state current of a transistor can be decreased.

In the oxide semiconductor layer, hydrogen, nitrogen, carbon, silicon, and a metal element other than main components are impurities. For example, hydrogen and nitrogen form donor levels to increase the carrier density. Silicon forms impurity levels in an oxide semiconductor layer. The impurity levels serve as traps and might cause deterioration of electrical characteristics of the transistor. It is preferable to reduce the concentration of the impurities in the oxide semiconductor layer and at interfaces with other layers.

Note that in order that a transistor in which an oxide semiconductor layer serves as a channel have stable electrical characteristics, it is effective to reduce the concentration of impurities in the oxide semiconductor layer to make the oxide semiconductor layer intrinsic or substantially intrinsic. The term "substantially intrinsic" refers to the state where an oxide semiconductor layer has a carrier density lower than $1\times10^{17}/cm^3$, preferably lower than $1\times10^{15}/cm^3$, further preferably lower than $1\times10^{13}/cm^3$.

In order to make the oxide semiconductor layer intrinsic or substantially intrinsic, in SIMS (secondary ion mass spectrometry), for example, the concentration of silicon at a certain depth of the oxide semiconductor layer or in a region of the oxide semiconductor layer is lower than $1\times10^{19}$ atoms/$cm^3$, preferably lower than $5\times10^{18}$ atoms/$cm^3$, further preferably lower than $1\times10^{18}$ atoms/$cm^3$. Further, the concentration of hydrogen at a certain depth of the oxide semiconductor layer or in a region of the oxide semiconductor layer is lower than or equal to $2\times10^{20}$ atoms/$cm^3$, preferably lower than or equal to $5\times10^{19}$ atoms/$cm^3$, further preferably lower than or equal to $1\times10^{19}$ atoms/$cm^3$, still further preferably lower than or equal to $5\times10^{18}$ atoms/$cm^3$. Further, the concentration of nitrogen at a certain depth of the oxide semiconductor layer or in a region of the oxide semiconductor layer is lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

In the case where the oxide semiconductor layer includes crystals, high concentration of silicon or carbon might reduce the crystallinity of the oxide semiconductor layer. In order not to lower the crystallinity of the oxide semiconductor layer, for example, the concentration of silicon at a certain depth of the oxide semiconductor layer or in a region of the oxide semiconductor layer is lower than $1\times10^{19}$ atoms/$cm^3$, preferably lower than $5\times10^{18}$ atoms/$cm^3$, further preferably lower than $1\times10^{18}$ atoms/$cm^3$. Further, the concentration of carbon at a certain depth of the oxide semiconductor layer or in a region of the oxide semiconductor layer is lower than $1\times10^{19}$ atoms/$cm^3$, preferably lower than $5\times10^{18}$ atoms/$cm^3$, further preferably lower than $1\times10^{18}$ atoms/$cm^3$, for example.

Specifically, various experiments can prove a low off-state current of a transistor including a channel formation region formed of a highly-purified oxide semiconductor film. For example, even when an element has a channel width of $1\times10^6$ µm and a channel length of 10 µm, off-state current can be lower than or equal to the measurement limit of a semiconductor parameter analyzer, i.e., lower than or equal to $1\times10^{-13}$ A, at voltage (drain voltage) between a source electrode and a drain electrode of from 1 V to 10 V. In this case, it can be seen that the off-state current standardized on the channel width of the transistor is lower than or equal to 100 zA/µm. In addition, a capacitor and a transistor are connected to each other and the off-state current is measured with a circuit in which electrical charges flowing into or from the capacitor is controlled by the transistor. In the measurement, a purified oxide semiconductor film has been used for a channel formation region of the transistor, and the off-state current of the transistor has been measured from a change in the number of electrical charges of the capacitor per unit time. As a result, it is found that in the case where the voltage between the source electrode and the drain electrode of the transistor is 3 V, a lower off-state current of several tens of yoctoamperes per micrometer (yA/µm) can be obtained. Accordingly, the off-state current of the transistor including a channel formation region formed of the highly purified oxide semiconductor film is considerably lower than that of a transistor including silicon having crystallinity.

Note that the oxide semiconductor preferably contains at least indium (In) or zinc (Zn). In particular, In and Zn are preferably contained. In addition, as a stabilizer for reducing the variation in electrical characteristics of a transistor using the oxide semiconductor, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer.

As another stabilizer, one or more of lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used. The above oxide semiconductors may include silicon.

Note that an In—Ga—Zn-based oxide, for example, means an oxide containing In, Ga, and Zn, and there is no limitation on the ratio of In, Ga, and Zn. The In—Ga—Zn-based oxide may contain a metal element other than In, Ga, and Zn. The In—Ga—Zn-based oxide has sufficiently high resistance when there is no electric field and thus off-state current can be sufficiently reduced. In addition, also having high field-effect mobility, the In—Ga—Zn-based oxide is suitable for a semiconductor material used in a semiconductor device.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, the composition is not limited to those described above, and a material having an appropriate composition may be used depending on needed electrical characteristics (such as mobility and threshold voltage). Further, it is preferable to appropriately set the carrier density, the impurity concentration, the defect density, the atomic ratio of a metal element and oxygen, the interatomic distance, the density, or the like in order to obtain necessary semiconductor characteristics.

For example, the oxide semiconductor film can be formed by a sputtering method using a target containing indium (In), gallium (Ga), and zinc (Zn). In the case where an In—Ga—Zn-based oxide semiconductor film is formed by a sputtering method, it is preferable to use a target of an In—Ga—Zn-based oxide with an atomic ratio of In:Ga:Zn=1:1:1, 5:5:6, 4:2:3, 3:1:2, 1:1:2, 2:1:3, 1:3:2, 1:3:4, 1:6:4, or 3:1:4. When the oxide semiconductor film is formed using an In—Ga—Zn-based oxide target having the aforementioned atomic ratio, a crystal is readily formed. The filling rate of the target containing In, Ga, and Zn is 90% or higher, preferably 95% or higher. With the use of the target with high filling rate, a dense oxide semiconductor film is formed.

In the case where an In—Zn-based oxide material is used as an oxide semiconductor, a target of the In—Zn-based oxide has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=1.5:1 to 15:1 in an atomic ratio ($In_2O_3$:ZnO=3:4 to 15:2 in a molar ratio). For example, in a target used for formation of an oxide semiconductor film including an In—Zn-based oxide which has an atomic ratio of In:Zn:O=X:Y:Z, the relation of Z>1.5X+Y is satisfied. The mobility can be improved by keeping the ratio of Zn within the above range.

In the case of forming an In—Sn—Zn-based oxide semiconductor film as the oxide semiconductor film by a sputtering method, it is preferred to use an In—Sn—Zn—O target containing In, Sn, and Zn at an atomic ratio of 1:1:1, 2:1:3, 1:2:2, or 20:45:35.

A structure of the oxide semiconductor film is described below.

Note that in this specification, a term "parallel" indicates that the angle formed between two straight lines is greater than or equal to −10° and less than or equal to 10°, and is accordingly used to express the case where the angle is greater than or equal to −5° and less than or equal to 5°. In addition, a term "perpendicular" indicates that the angle formed between two straight lines is greater than or equal to 80° and less than or equal to 100°, and is accordingly used to express the case where the angle is greater than or equal to 85° and less than or equal to 95°.

In this specification, the trigonal and rhombohedral crystal systems are included in the hexagonal crystal system.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm.

In a transmission electron microscope (TEM) image of the CAAC-OS film, a boundary between crystal parts, that is, a crystal grain boundary is not clearly observed. Thus, in the CAAC-OS film, a reduction in electron mobility due to the crystal grain boundary is unlikely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. In contrast, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of the top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of the top surface of the CAAC-OS film. Thus, for example, in the case where a shape of the CAAC-OS film is changed by etching or the like, the c-axis might not be necessarily parallel to a normal vector of a formation surface or a normal vector of the top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film with a low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and has high reliability. It takes a long time for electrical charges trapped by the carrier traps in the oxide semiconductor film to be released, and might behave like fixed electrical charges. Thus, the transistor which includes the oxide semiconductor film having a high impurity concentration and a high density of defect states has unstable electrical characteristics in some cases.

With use of the CAAC-OS film in a transistor, a variation in electrical characteristics of the transistor due to irradiation with visible light or ultraviolet light is small.

Next, a microcrystalline oxide semiconductor film is described.

In an image obtained with the TEM, crystal parts cannot be found clearly in the microcrystalline oxide semiconductor film in some cases. In most cases, the size of a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm, is specifically referred to as nanocrystal (nc). An oxide semiconductor film including nanocrystal is referred to as an nc-OS (nanocrystalline oxide semiconductor) film. In an image of the nc-OS film which is obtained with the TEM, for example, a crystal grain boundary is not clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order in some cases. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in an electron diffraction pattern (also referred to as a selected-area electron diffraction pattern) of the nc-OS film obtained by using an electron beam having a diameter (e.g., larger than or equal to 50 nm) larger than that of a crystal part. Meanwhile, spots are shown in a nanobeam electron diffraction pattern of the nc-OS film obtained by using an electron beam having a diameter (e.g., larger than or equal to 1 nm and smaller than or equal to 30 nm) close to, or smaller than or equal to that of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Note that the oxide semiconductor film may be a stacked film including two or more films of an amorphous oxide semiconductor film, a microcrystalline oxide semiconductor film, and a CAAC-OS film, for example.

For example, the CAAC-OS film is formed by a sputtering method using a polycrystalline oxide semiconductor sputtering target. When ions collide with the sputtering target, a crystal region included in the sputtering target might be separated from the target along an a-b plane; in other words, a sputtered particle having a plane parallel to an a-b plane (flat-plate-like sputtered particle or pellet-like sputtered particle) might be separated from the sputtering target. In that case, the flat-plate-like or pellet-like sputtered particle reaches a substrate while maintaining its crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, impurities (e.g., hydrogen, water, carbon dioxide, or nitrogen) which exist in the deposition chamber may be reduced. Furthermore, impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature is higher than or equal to 100° C. and lower than or equal to 740° C., preferably higher than or equal to 200° C. and lower than or equal to 500° C. When the substrate heating temperature during the deposition is increased and the flat-plate-like or pellet-like sputtered particle reaches the substrate, migration occurs over the substrate, so that a flat plane of the sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As a sputtering target, an In—Ga—Zn—O compound target can be used, for example. The In—Ga—Zn—O compound target is a polycrystalline body that is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. The grain size of the polycrystalline body is preferably as small as possible, for example, less than or equal to 1 μm. The kinds of powder and the molar ratio for mixing powder may be determined as appropriate depending on the desired sputtering target.

Figure 14A:
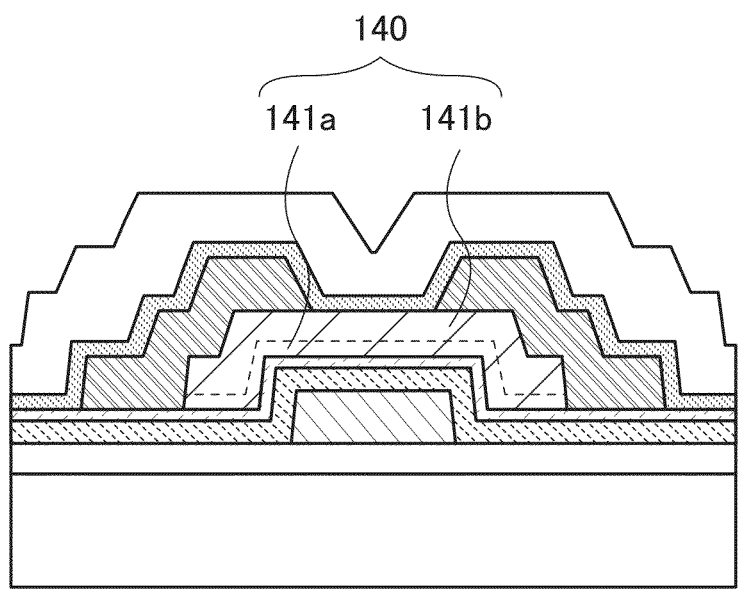
FIGS. 14A and 14B are cross-sectional views each illustrating a transistor.

The oxide semiconductor film may include a plurality of oxide semiconductor films stacked. For example, as in a transistor illustrated in FIG. 14A, stacked layers of a first oxide semiconductor film 141a and a second oxide semiconductor film 141b may constitute the oxide semiconductor layer 140. The first oxide semiconductor film 141a and the second oxide semiconductor film 141b may include metal oxides having different atomic ratios. For example, one of the oxide semiconductor films may be formed using one of an oxide containing two kinds of metals, an oxide containing three kinds of metals, and an oxide containing four kinds of metals, and the other of the oxide semiconductor films may be formed using one of the above which is different from the oxide used for the one oxide semiconductor film.

Alternatively, the first oxide semiconductor film 141a and the second oxide semiconductor film 141b may include the same constituent elements with different atomic ratios. For example, one of the oxide semiconductor films may contain In, Ga, and Zn at an atomic ratio of 1:1:1, 5:5:6, or 3:1:2, and the other of the oxide semiconductor films may contain In, Ga, and Zn at an atomic ratio of 1:3:2, 1:3:4, 1:3:6, 1:6:4, or 1:9:6. Note that the proportion of each atom in the atomic ratio of the oxide semiconductor film may vary within a range of ±20% as an error.

In the above, one of the first oxide semiconductor film and the second oxide semiconductor film, which is closer to the gate electrode than the other (the oxide semiconductor film on the channel side), has an atomic ratio of In≥Ga; and the other oxide semiconductor film, which is farther from the gate electrode (the oxide semiconductor film on the back channel side), has an atomic ratio of In<Ga. In that case, a transistor with high field-effect mobility can be manufactured. In contrast, when the oxide semiconductor film on the channel side has an atomic ratio of In<Ga and the oxide semiconductor film on the back channel side has an atomic ratio of In≥Ga, it is possible to reduce the amount of change in the threshold voltage of a transistor due to change over time or a reliability test.

Further alternatively, the semiconductor film of the transistor may have a three-layer structure of a first oxide semiconductor film, a second oxide semiconductor film, and a third oxide semiconductor film. In that case, the first to third oxide semiconductor films may include the same constituent elements with different atomic ratios. A transistor including a three-layer semiconductor film will be described with reference to FIG. 14B.

Figure 14B:
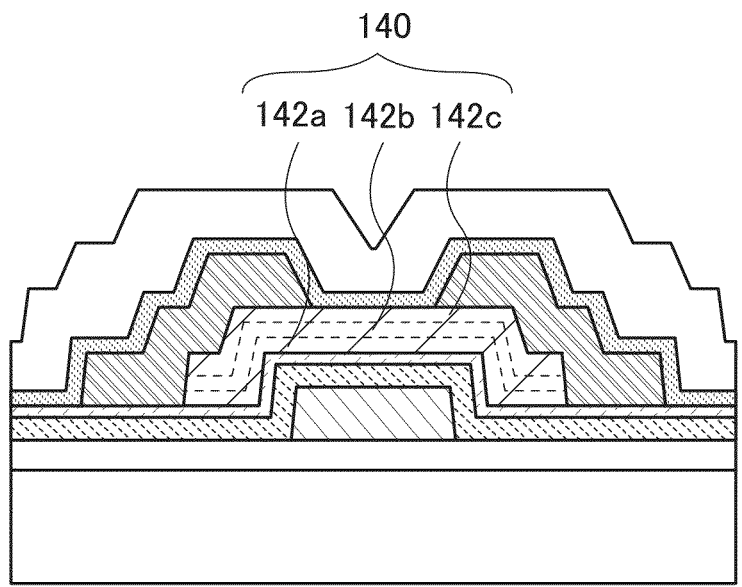

The transistor illustrated in FIG. 14B includes a first oxide semiconductor film 142a, a second oxide semiconductor film 142b, and a third oxide semiconductor film 142c which are stacked in this order from the gate insulating film side. The first oxide semiconductor film 142a and the third oxide semiconductor film 142c are formed using a material represented by $InM_{1x}Zn_yO_z$ (x≥1, y>1, z>0, $M_1$=Ga, Hf, or the like).

The second oxide semiconductor film 142b is formed using a material which can be represented by $InM_{2x}Zn_yO_z$ (x≥1, y≥x, z>0, $M_2$=Ga, Sn, or the like).

Materials of the first to third oxide semiconductor films 142a to 142c are selected as appropriate so as to form a well-shaped structure in which the conduction band minimum in the second oxide semiconductor film 142b is deeper from the vacuum level than the conduction band minimum in the first and third oxide semiconductor films 142a and 142c.

For example, the first oxide semiconductor film 142a and the third oxide semiconductor film 142c may each have an atomic ratio of In:Ga:Zn=1:3:2, 1:3:4, 1:3:6, 1:6:4, or 1:9:6; the second oxide semiconductor film 142b may have an atomic ratio of In:Ga:Zn=1:1:1, 5:5:6, or 3:1:2.

Since the first to third oxide semiconductor films 142a to 142c include the same constituent elements, the second oxide semiconductor film 142b has few defect states (trap levels) at the interface with the first oxide semiconductor film 142a. Specifically, the defect states (trap levels) are fewer than those at the interface between the gate insulating film and the first oxide semiconductor film 142a. For this reason, when the oxide semiconductor films are stacked in the above manner, the amount of change in the threshold voltage of a transistor due to a change over time or a reliability test can be reduced.

Further, materials of the first to third oxide semiconductor films 142a to 142c are selected as appropriate so as to form a well-shaped structure in which the conduction band minimum in the second oxide semiconductor film 142b is deeper from the vacuum level than the conduction band minimum in the first and third oxide semiconductor films 142a and 142c. As a result, the field-effect mobility of the transistor can be increased and the amount of change in the threshold voltage of the transistor due to change over time or a reliability test can be reduced.

Further, the first to third oxide semiconductor films 142a to 142c may be formed using oxide semiconductors having different crystallinities. That is, the first to third oxide semiconductor films may be formed using a combination of any of a single crystal oxide semiconductor, a polycrystalline oxide semiconductor, a microcrystalline (nanocrystalline) oxide semiconductor, an amorphous oxide semiconductor, and a CAAC-OS film.

At least the second oxide semiconductor film 142b, which can serve as a channel formation region, is preferably a CAAC-OS film.

When the oxide semiconductor film is in contact with a conductive material which is easily bonded to oxygen (e.g., a metal used for the source electrode or the drain electrode), oxygen in the oxide semiconductor film is diffused into the conductive material which is easily bonded to oxygen. Such a phenomenon occurs more frequently as the temperature is raised. Some heating steps are included in the manufacturing process of the transistor; thus, owing to the phenomenon, oxygen vacancies are generated in and around the region of the oxide semiconductor layer which is in contact with the source electrode or the drain electrode, so that the region becomes an n-type region. Accordingly, the n-type region can serve as a source or drain of the transistor.

When a transistor including a channel formation region formed of the oxide semiconductor described in this embodiment is used, an imaging device that is highly stable to irradiation with radial rays such as X-rays and has a structure that can inhibit a decrease in electrical characteristics can be provided.

This embodiment can be implemented in appropriate combination with any of the structures described in the other embodiments and Example.

Example

In this example, electrical characteristics of transistors of the present invention including gate insulating films with different structures are described.

In this example, a plurality of transistors with the structure illustrated in FIG. 1 were used. In the gate insulating film 130, the first insulating film 131 was formed of a silicon oxynitride film with a thickness of 200 nm and the second insulating film 132 was formed of a silicon oxide film with a thickness of 5 nm to 50 nm.

Next, a method for manufacturing the transistors is described.

First, a glass substrate was used as the substrate 100. As the base insulating film 110, stacked films of a silicon nitride film and a silicon oxynitride film were formed over the glass substrate by a parallel-plate plasma CVD method. The deposition conditions of the silicon nitride film were as follows: flow rate ratio, 1:10:27 (silane:ammonia:hydrogen); deposition pressure, 60 Pa; power density, 0.104 W/cm² (RF 13.56 MHz); electrode-substrate distance, 28 mm; substrate temperature, 330° C.; and thickness, 100 nm. The deposition conditions of the silicon oxynitride film were as follows: flow rate ratio, 1:120 (silane:dinitrogen monoxide); deposition pressure, 22 Pa; power density, 0.005 W/cm² (RF 13.56 MHz); electrode-substrate distance, 28 mm; substrate temperature, 330° C.; and thickness, 150 nm.

Next, a tungsten film with a thickness of 100 nm was formed over the base insulating film 110 by a sputtering method. The tungsten film was selectively etched to form the gate electrode layer 120.

Then, as the first insulating film 131, a silicon nitride film was formed over the base insulating film 110 and the gate electrode layer 120 by a parallel-plate plasma CVD method. The deposition conditions of the silicon nitride film were as follows: flow rate ratio, 1:10 (silane:nitrogen); deposition pressure, 200 Pa; power density, 0.334 W/cm² (RF 27.12

MHz); electrode-substrate distance, 28 mm; substrate temperature, 350° C.; and thickness, 200 nm.

Next, as the second insulating film 132, a silicon oxynitride film was formed over the first insulating film 131 by a parallel-plate plasma CVD method. The deposition conditions of the silicon oxynitride film were as follows: flow rate ratio, 1:167 (silane:dinitrogen monoxide); deposition pressure, 40 Pa; power density, 0.017 W/cm$^2$ (RF 27.12 MHz); electrode-substrate distance, 28 mm; and substrate temperature, 350° C. Here, the thickness of the silicon oxynitride film varies depending on the transistor (5 nm, 15 nm, 20 nm, 30 nm, and 50 nm).

Next, an In—Ga—Zn oxide film (In:Ga:Zn=1:1:1 in an atomic ratio) was formed over the second insulating film 132 by a sputtering method.

The deposition conditions of the In—Ga—Zn oxide film were as follows: target, an In—Ga—Zn oxide with an atomic ratio of In:Ga:Zn=1:1:1; sputtering gas flow rate ratio, 1:1 (argon:oxygen); deposition pressure, 0.6 Pa; power density, 0.995 W/cm$^2$ (AC); electrode-substrate distance, 150 mm; and substrate temperature, 170° C. The thickness of the In—Ga—Zn oxide film was 35 nm.

Next, the samples formed up to the In—Ga—Zn oxide film were subjected to heat treatment for 1 hour in a nitrogen atmosphere and were further subjected to heat treatment at 450° C. for 1 hour in a mixed atmosphere of oxygen and nitrogen.

Then, the In—Ga—Zn oxide film was selectively etched to form the oxide semiconductor layer 140.

Next, stacked films formed of a tungsten film with a thickness of 50 nm, an aluminum film with a thickness of 400 nm, and a titanium film with a thickness of 100 nm were formed over the oxide semiconductor layer 140 by a sputtering method. The stacked films were selectively etched to form the source electrode layer 150 and the drain electrode layer 160.

Next, as the insulating layer 170, a silicon oxynitride film was formed over the second insulating film 132, the oxide semiconductor layer 140, the source electrode layer 150, and the drain electrode layer 160 by a parallel-plate plasma CVD method. The deposition conditions of the silicon oxynitride film were as follows: flow rate ratio, 1:133 (silane:dinitrogen monoxide); deposition pressure, 40 Pa; power density, 0.025 W/cm$^2$ (RF 27.12 MHz); electrode-substrate distance, 28 mm; substrate temperature, 220° C.; and thickness, 50 nm.

Then, as the insulating layer 180, a silicon oxynitride film was formed over the insulating layer 170 by a parallel-plate plasma CVD method. The deposition conditions of the silicon oxynitride film were as follows: flow rate ratio, 1:25 (silane:dinitrogen monoxide); deposition pressure, 200 Pa; power density, 0.25 W/cm$^2$ (RF 27.12 MHz); electrode-substrate distance, 28 mm; substrate temperature, 220° C.; and thickness, 400 nm.

Next, the samples formed up to the insulating layer 180 were subjected to heat treatment at 350° C. for 1 hour in a mixed atmosphere of oxygen and nitrogen.

Then, a silicon nitride film was formed over the insulating layer 180 by a plasma CVD method. The deposition conditions of the silicon nitride film were as follows: flow rate ratio: 1:100:2 (silane:nitrogen:ammonia); deposition pressure, 100 Pa; power density, 0.167 W/cm$^2$ (RF 27.12 MHz); electrode-substrate distance, 28 mm; substrate temperature, 350° C.; and thickness, 100 nm.

Next, as a planarization film, an acrylic resin was formed to have a thickness of 1.5 μm over the silicon nitride film.

Last, the samples formed up to the acrylic resin were subjected to heat treatment at 250° C. for 1 hour in a nitrogen atmosphere.

Figure 15A:
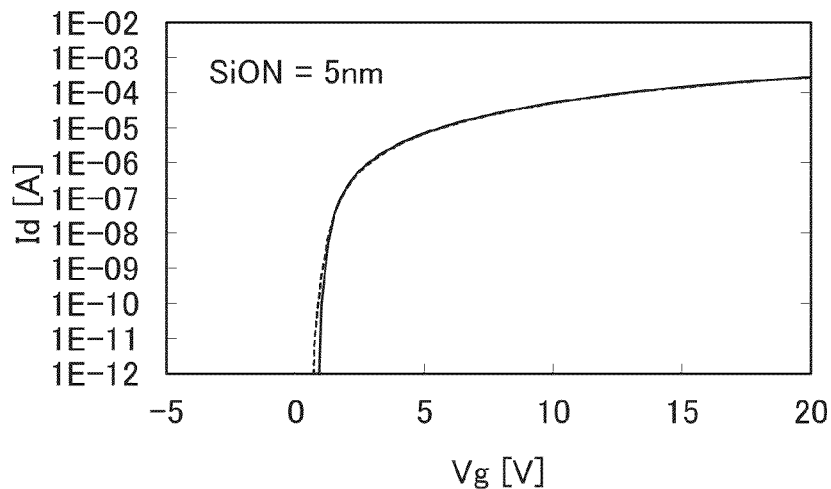
FIGS. 15A to 15C each show $I_d$-$V_g$ characteristics of a transistor before and after X-ray irradiation.
Figure 15B:
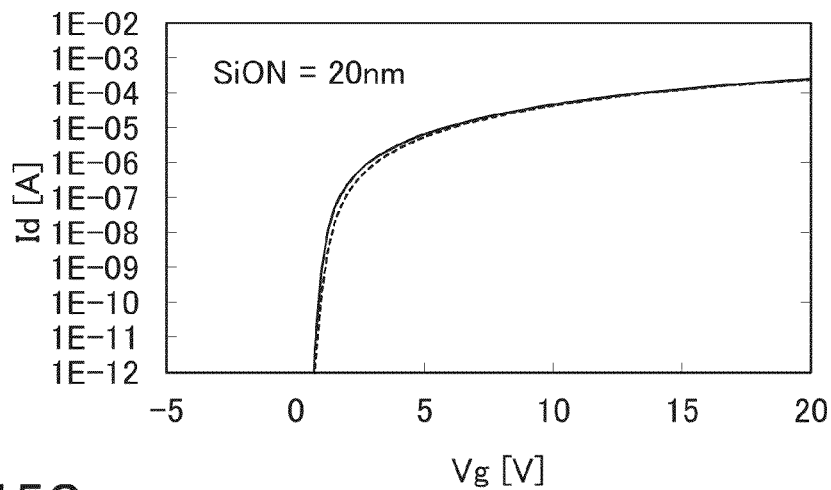
Figure 15C:
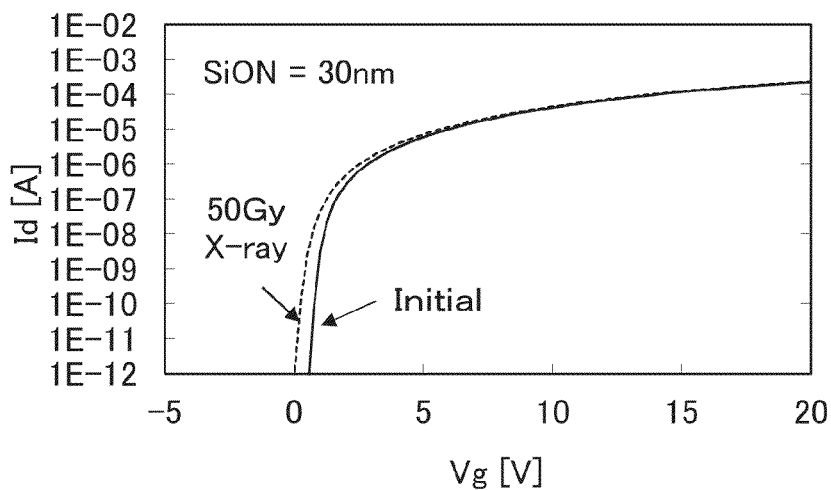

FIGS. 15A, 15B, and 15C show Id-Vg characteristics of the transistors formed in the above manner, in which the thickness of the second insulating film 132 in the gate insulating film 130 are 5 nm, 20 nm, and 30 nm, respectively. In the drawings, the solid line represents initial characteristics, and the dotted line represents characteristics after 50-Gy X-ray irradiation. Note that L/W of the transistors is 6 μm/50 μm, and the drain voltage (Vd) is 10 V.

In the case of the transistor including the 5-nm-thick second insulating film 132 and the transistor including the 20-nm-thick second insulating film 132, a large change in Id-Vg characteristics by X-ray irradiation does not occur; in contrast, in the case of the transistor including the 30-nm-thick second insulating film 132, the gate voltage at the time when drain current rises largely shifts in the negative direction. Note that in this specification, the value of gate voltage at the time when drain current rises is defined as a shift value.

Figure 16A:
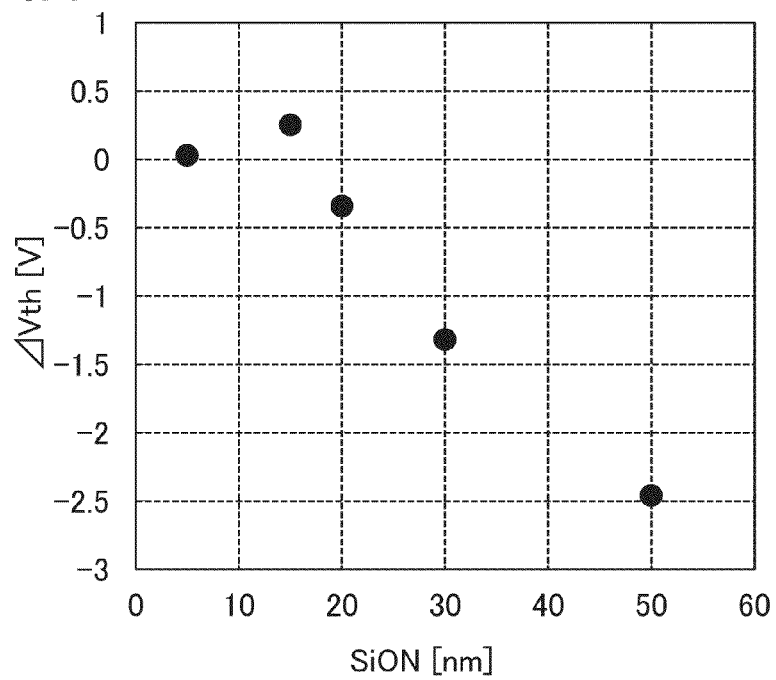
FIG. 16A shows a relationship between a variation in threshold voltage between before and after X-ray irradiation and the thickness of a silicon oxynitride film.
Figure 16B:
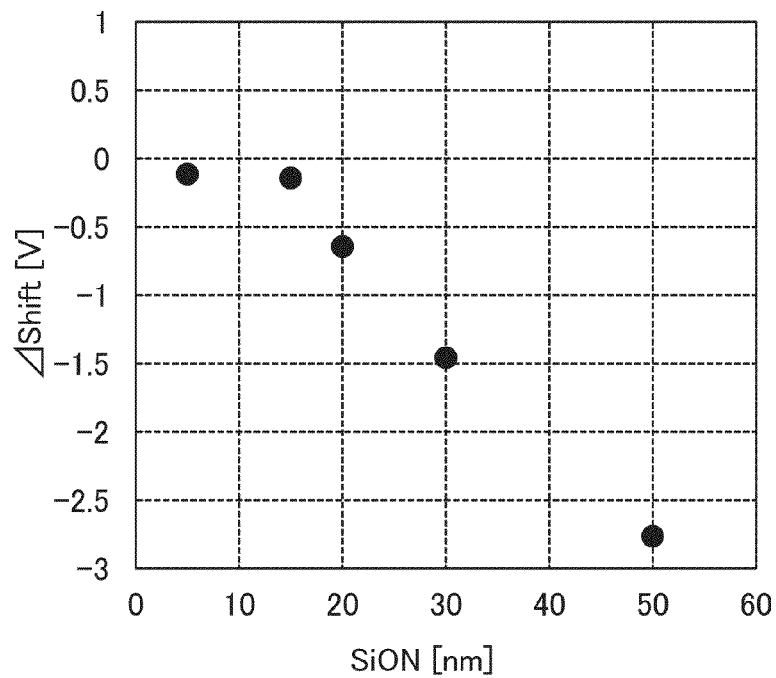
FIG. 16B shows a relationship between a variation in shift value between before and after X-ray irradiation and the thickness of a silicon oxynitride film.

FIG. 16A is a graph showing a relationship between a variation in threshold voltage between before and after X-ray irradiation (ΔVth) (vertical axis) and the thickness of the second insulating film 132 (horizontal axis). FIG. 16B is a graph showing a change of a variation in shift value between before and after X-ray irradiation (ΔShift). As is apparent from FIGS. 16A and 16B, when the thickness of the silicon oxynitride film becomes larger than 20 nm, degradation of the transistors is large. In other words, with the second insulating film 132 having a thickness in the range of 5 nm to 20 nm, resistance to X-rays can be high.

Note that this example can be combined with embodiments in this specification as appropriate.

This application is based on Japanese Patent Application serial no. 2013-128794 filed with Japan Patent Office on Jun. 19, 2013, the entire contents of which are hereby incorporated by reference.

What is claimed is:

1. A semiconductor device comprising a light-receiving element and a first transistor connected to the light-receiving element, wherein the first transistor comprises:
   a gate electrode over an insulating surface;
   a gate insulating film comprising a first insulating film over the gate electrode and a second insulating film over the first insulating film; and
   an oxide semiconductor layer over the second insulating film,
   wherein the first insulating film comprises a silicon nitride,
   wherein the second insulating film comprises a silicon oxide or a silicon oxynitride,
   wherein the first insulating film has a thickness of 100 nm to 400 nm, and
   wherein the second insulating film has a thickness of 5 nm to 20 nm.

2. The semiconductor device according to claim 1, wherein the semiconductor device is an imaging device using X-rays or gamma-rays.

3. The semiconductor device according to claim 1, wherein the light-receiving element is a photodiode.

4. The semiconductor device according to claim 1, wherein the light-receiving element is a variable resistive element.

5. The semiconductor device according to claim 1, further comprising a second transistor, a third transistor, and a charge storage portion,
   wherein a first terminal of the first transistor is connected to the charge storage portion,
   wherein a second terminal of the first transistor is connected to a first terminal of the light-receiving element,
   wherein a gate of the second transistor is connected to the charge storage portion, and wherein a first terminal of the second transistor is connected to a first terminal of the third transistor.

6. The semiconductor device according to claim 5, further comprising a fourth transistor comprising a first terminal connected to the charge storage portion.

7. A semiconductor device comprising a pixel and a scintillator overlapping the pixel, the pixel comprising:
   a light-receiving element configured to receive light; and
   a first transistor connected to the light-receiving element, wherein the first transistor comprises:
      a gate electrode over an insulating surface;
      a gate insulating film comprising a first insulating film over the gate electrode and a second insulating film over the first insulating film; and
      an oxide semiconductor layer over the second insulating film,
   wherein the first insulating film comprises a silicon nitride,
   wherein the second insulating film comprises a silicon oxide or a silicon oxynitride,
   wherein the first insulating film has a thickness of 100 nm to 400 nm,
   wherein the second insulating film has a thickness of 5 nm to 20 nm, and
   wherein the scintillator is configured to convert X-rays or gamma-rays to the light.

8. The semiconductor device according to claim 7, wherein the light-receiving element is a photodiode.

9. The semiconductor device according to claim 7, wherein the light-receiving element is a variable resistive element.

10. The semiconductor device according to claim 7, further comprising a second transistor, a third transistor, and a charge storage portion,
    wherein a first terminal of the first transistor is connected to the charge storage portion,
    wherein a second terminal of the first transistor is connected to a first terminal of the light-receiving element,
    wherein a gate of the second transistor is connected to the charge storage portion, and
    wherein a first terminal of the second transistor is connected to a first terminal of the third transistor.

11. The semiconductor device according to claim 10, further comprising a fourth transistor comprising a first terminal connected to the charge storage portion.

12. A semiconductor device comprising a light-receiving element and a first transistor connected to the light-receiving element, wherein the first transistor comprises:
    a gate electrode over an insulating surface;
    a gate insulating film comprising a first insulating film over the gate electrode and a second insulating film over the first insulating film;
    an oxide semiconductor layer over the second insulating film, the oxide semiconductor layer overlapping with the gate electrode;
    a source electrode layer and a drain electrode layer in contact with part of the oxide semiconductor layer; and
    an insulating layer over the gate insulating film, the oxide semiconductor layer, the source electrode layer, and the drain electrode layer,
    wherein the first insulating film comprises a silicon nitride,
    wherein the second insulating film comprises a silicon oxide or a silicon oxynitride,
    wherein the first insulating film has a thickness of 100 nm to 400 nm, and
    wherein the second insulating film has a thickness of 5 nm to 20 nm.

13. The semiconductor device according to claim 12, wherein the semiconductor device is an imaging device using X-rays or gamma-rays.

14. The semiconductor device according to claim 12, wherein the light-receiving element is a photodiode.

15. The semiconductor device according to claim 12, wherein the light-receiving element is a variable resistive element.

16. The semiconductor device according to claim 12, further comprising a second transistor, a third transistor, and a charge storage portion,
    wherein a first terminal of the first transistor is connected to the charge storage portion,
    wherein a second terminal of the first transistor is connected to a first terminal of the light-receiving element,
    wherein a gate of the second transistor is connected to the charge storage portion, and
    wherein a first terminal of the second transistor is connected to a first terminal of the third transistor.

17. The semiconductor device according to claim 16, further comprising a fourth transistor comprising a first terminal connected to the charge storage portion.

* * * * *